United States Patent
Quinn et al.

(10) Patent No.: US 10,852,773 B2
(45) Date of Patent: Dec. 1, 2020

(54) MULTI-FORM FACTOR INFORMATION HANDLING SYSTEM (IHS) WITH AN ACCESSORY BACKPACK

(71) Applicant: Dell Products, L.P., Round Rock, TX (US)

(72) Inventors: Liam B. Quinn, Austin, TX (US); Christopher Alan Robinette, Alameda, CA (US); Michiel Sebastiaan Emanuel Petrus Knoppert, Amsterdam (NL)

(73) Assignee: Dell Products, L.P., Round Rock, TX (US)

( * ) Notice: Subject to any disclaimer, the term of this patent is extended or adjusted under 35 U.S.C. 154(b) by 126 days.

(21) Appl. No.: 16/050,689

(22) Filed: Jul. 31, 2018

(65) Prior Publication Data

US 2020/0042047 A1 Feb. 6, 2020

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |

(52) U.S. Cl.
CPC .......... *G06F 1/1681* (2013.01); *G06F 1/1616* (2013.01); *G06F 1/1635* (2013.01); *G06F 1/1656* (2013.01); *G06F 1/1669* (2013.01); *H05K 7/1401* (2013.01)

(58) Field of Classification Search
CPC .... G06F 1/1681; G06F 1/1616; G06F 1/1632; G06F 1/1635; G06F 1/1656; G06F 1/1669; G06F 1/1647; G06F 1/1692; G06F 1/1671
See application file for complete search history.

(56) References Cited

U.S. PATENT DOCUMENTS

| | | | | |
|---|---|---|---|---|
| 5,241,303 | A * | 8/1993 | Register | G06F 1/1615 178/18.03 |
| 5,262,926 | A * | 11/1993 | Hall | G06F 1/1639 361/679.09 |
| 5,440,502 | A * | 8/1995 | Register | G06F 1/1626 345/168 |
| 5,739,810 | A | 4/1998 | Merkel | |
| 5,847,698 | A | 12/1998 | Reavey et al. | |
| 6,341,061 | B1 * | 1/2002 | Eisbach | G06F 1/1616 312/223.2 |
| 6,510,048 | B2 | 1/2003 | Rubenson et al. | |

(Continued)

OTHER PUBLICATIONS

Binary Fortress Software, "Precise Monitor Controls," 2017-2018, 2 pages, retrieved Oct. 15, 2018, available at https://www.displayfusion.com/Features/MonitorConfig/.

(Continued)

*Primary Examiner* — Anthony M Haughton
(74) *Attorney, Agent, or Firm* — Fogarty LLP

(57) ABSTRACT

Embodiments of a multi-form factor Information Handling System (IHS) with an accessory backpack are described. In some embodiments, an IHS may include a first display and a second display coupled to the first display, where the second display comprises a catch, and where the catch is configured to magnetically engage a corresponding hook of an accessory in response to a top surface of the accessory being placed under a back portion of the second display.

20 Claims, 22 Drawing Sheets

(56) References Cited

U.S. PATENT DOCUMENTS

| | | | | |
|---|---|---|---|---|
| 6,700,773 | B1* | 3/2004 | Adriaansen | G06F 1/1618 345/156 |
| 6,922,333 | B2* | 7/2005 | Weng | G06F 1/1616 220/230 |
| 7,061,472 | B1* | 6/2006 | Schweizer | G06F 1/162 345/156 |
| 7,551,428 | B2 | 7/2009 | Homer et al. | |
| 7,663,602 | B2 | 2/2010 | Jones et al. | |
| 7,990,702 | B2* | 8/2011 | Tracy | G06F 1/1616 361/679.55 |
| 7,991,442 | B2 | 8/2011 | Kim | |
| 8,300,389 | B2* | 10/2012 | Kang | H04M 1/0254 361/679.01 |
| 8,310,823 | B2 | 11/2012 | Stoltz | |
| 8,331,098 | B2 | 12/2012 | Leung | |
| 8,803,816 | B2 | 8/2014 | Kilpatrick, II et al. | |
| 8,988,876 | B2 | 3/2015 | Corbin et al. | |
| 9,684,342 | B2 | 6/2017 | Kim et al. | |
| 9,740,237 | B2 | 8/2017 | Moore et al. | |
| 9,874,908 | B2 | 1/2018 | Han et al. | |
| 2004/0001049 | A1 | 1/2004 | Oakley | |
| 2006/0183505 | A1 | 8/2006 | Willrich | |
| 2008/0062625 | A1* | 3/2008 | Batio | G06F 1/1615 361/679.29 |
| 2009/0244016 | A1 | 10/2009 | Casparian et al. | |
| 2010/0039764 | A1* | 2/2010 | Locker | G06F 1/1615 361/679.29 |
| 2010/0238620 | A1 | 9/2010 | Fish | |
| 2010/0321275 | A1 | 12/2010 | Hinckley et al. | |
| 2011/0216485 | A1* | 9/2011 | Kang | G06F 1/1632 361/679.01 |
| 2015/0103014 | A1 | 4/2015 | Kim et al. | |
| 2016/0320810 | A1* | 11/2016 | Kim | G06F 1/1669 |
| 2017/0069299 | A1 | 3/2017 | Kwak et al. | |
| 2017/0255320 | A1 | 9/2017 | Kumar et al. | |
| 2017/0344120 | A1 | 11/2017 | Zuniga et al. | |
| 2018/0088632 | A1 | 3/2018 | Dreessen et al. | |
| 2018/0121012 | A1 | 5/2018 | Asrani | |
| 2018/0129391 | A1 | 5/2018 | Files et al. | |
| 2018/0188774 | A1 | 7/2018 | Ent et al. | |
| 2018/0232010 | A1 | 8/2018 | Kummer et al. | |

OTHER PUBLICATIONS

Microsoft, "ChangeDisplaySettingsExA function," 7 pages, retrieved Oct. 15, 2018, available at https://msdn.microsoft.com/en-us/library/dd183413(v=vs.85).aspx VS. https://docs.microsoft.com/en-us/windows/desktop/api/winuser/nf-winuser-changedisplaysettingsexa.

Microsoft, "SendKeys.Send(String) Method," 6 pages, retrieved Oct. 11, 2018, available at https://msdn.microsoft.com/en-us/library/system.windows.forms.sendkeys.send(v=vs.110).aspx.

Microsoft, "DoDragDrop function," 4 pages, retrieved Oct. 11, 2018, available at https://msdn.microsoft.com/en-us/library/windows/desktop/ms678486(v=vs.85).aspx.

Microsoft, "System Events and Mouse Messages," published May 30, 2018, 4 pages, retrieved Oct. 11, 2018, available at https://msdn.microsoft.com/en-us/library/windows/desktop/ms703320(v=vs.85).aspx.

Microsoft, "InkSystemGesture Enumeration," 3 pages, retrieved Oct. 11, 2018, available at https://msdn.microsoft.com/en-us/library/windows/desktop/ms695579(v=vs.85).aspx.

Microsoft, "GetWindowRect function," 3 pages, retrieved Oct. 11, 2018, available at https://msdn.microsoft.com/en-us/library/windows/desktop/ms633519(v=vs.85).aspx.

Microsoft, "PointerRoutedEventArgs Class," 9 pages, retrieved Oct. 11, 2018, available at https://docs.microsoft.com/en-us/uwp/api/Windows.UI.Xaml.Input.PointerRoutedEventArgs#Windows_UI_Xaml_Input_PointerRoutedEventArgs_GetCurrentPoint_Windows_UI_Xaml_UIElement_.

Microsoft, "SetWindowPos function," 7 pages, retrieved Oct. 11, 2018, available at https://msdn.microsoft.com/en-us/library/windows/desktop/ms633545(v=vs.85).aspx.

Microsoft, "Time Functions," published May 30, 2018, 5 pages, retrieved Oct. 11, 2018, available at https://msdn.microsoft.com/en-us/library/windows/desktop/ms725473(v=vs.85).aspx.

Microsoft, "How Do I Detect a Window Open Event," 11 pages, retrieved Oct. 15, 2018, available at https://social.msdn.microsoft.com/Forums/vstudio/en-US/1953f400-6f1c-49e0-a63e-d724bccc7676/how-do-i-detect-a-window-open-event?forum=csharpgeneral.

Microsoft, "How Do I Maximize/Minimize Applications Programmatically in C#?," 2 pages, retrieved Oct. 15, 2018, available at https://social.msdn.microsoft.com/Forums/vstudio/en-US/9bde4870-1599-4958-9ab4-902fa98ba53a/how-do-i-maximizeminimize-applications-programmatically-in-c?forum=csharpgeneral.

Microsoft, "WinMain Entry Point," 7 pages, retrieved Oct. 15, 2018, available at https://msdn.microsoft.com/en-us/library/ms633559(vs.85).aspx.

Stack Overflow, "Flow Can I Split a Window in Two in Windows API," 6 pages, retrieved Oct. 15, 2018, available at https://stackoverflow.com/questions/10467112/how-can-i-split-a-window-in-two-in-windows-api.

Microsoft, "Application User Model IDs (AppUserModelIDs)," published May 30, 2018, 8 pages, retrieved Oct. 15, 2018, available at https://docs.microsoft.com/en-us/windows/desktop/shell/appids.

Microsoft, "Mouse Events in Windows Forms," published Mar. 29, 2017, 6 pages, retrieved Oct. 15, 2018, available at https://docs.microsoft.com/en-us/dotnet/framework/winforms/mouse-events-in-windows-forms.

* cited by examiner

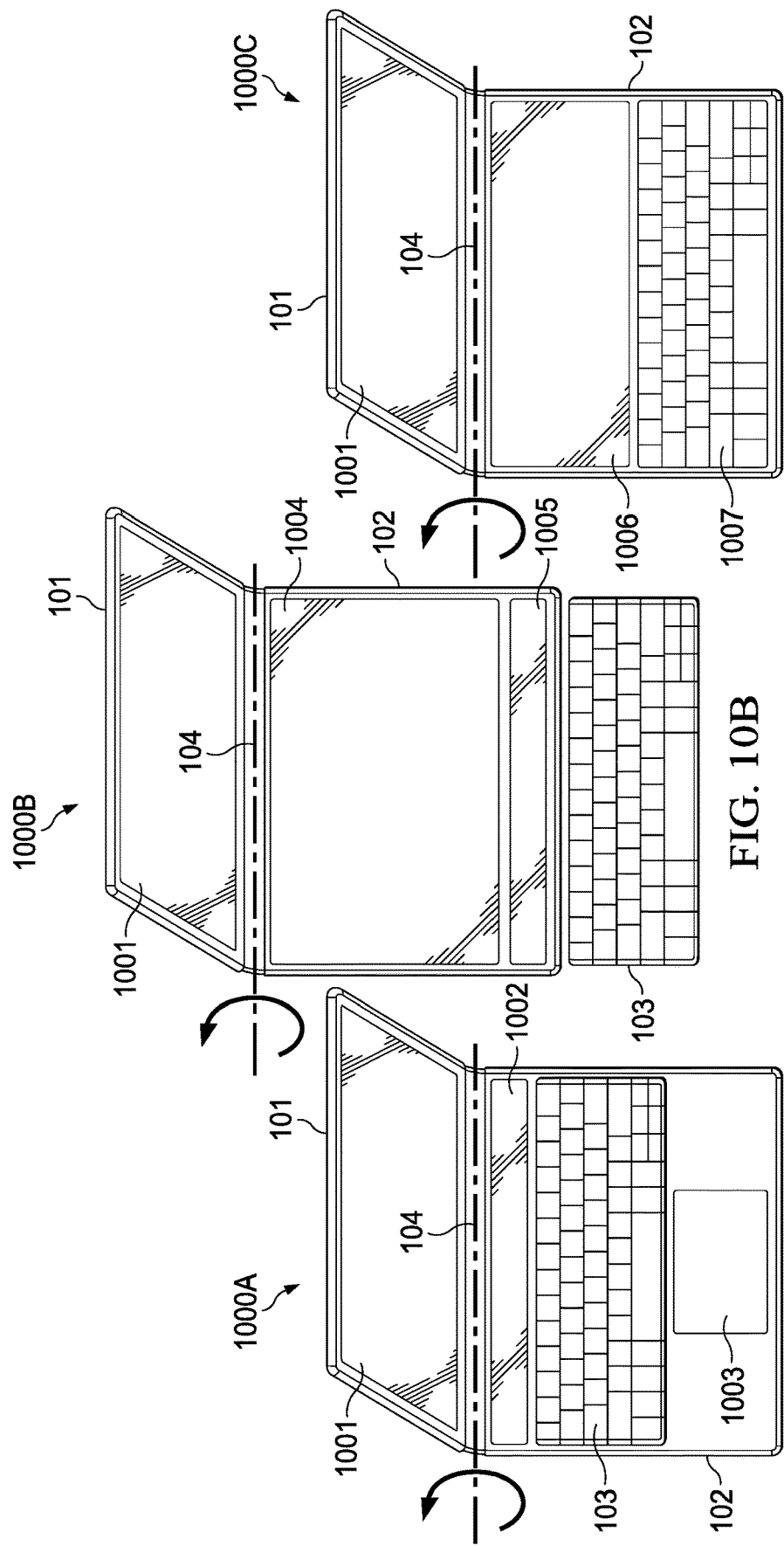

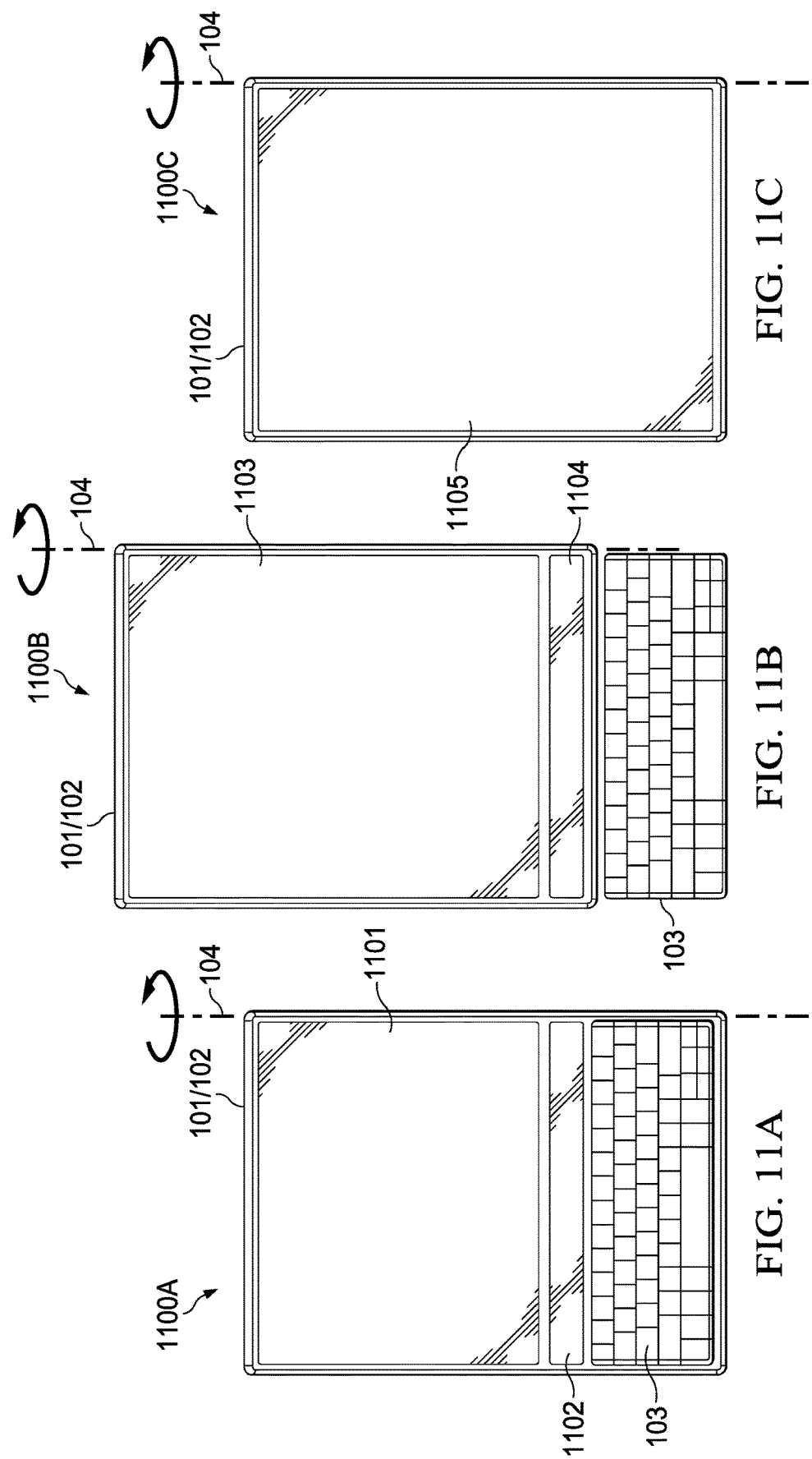

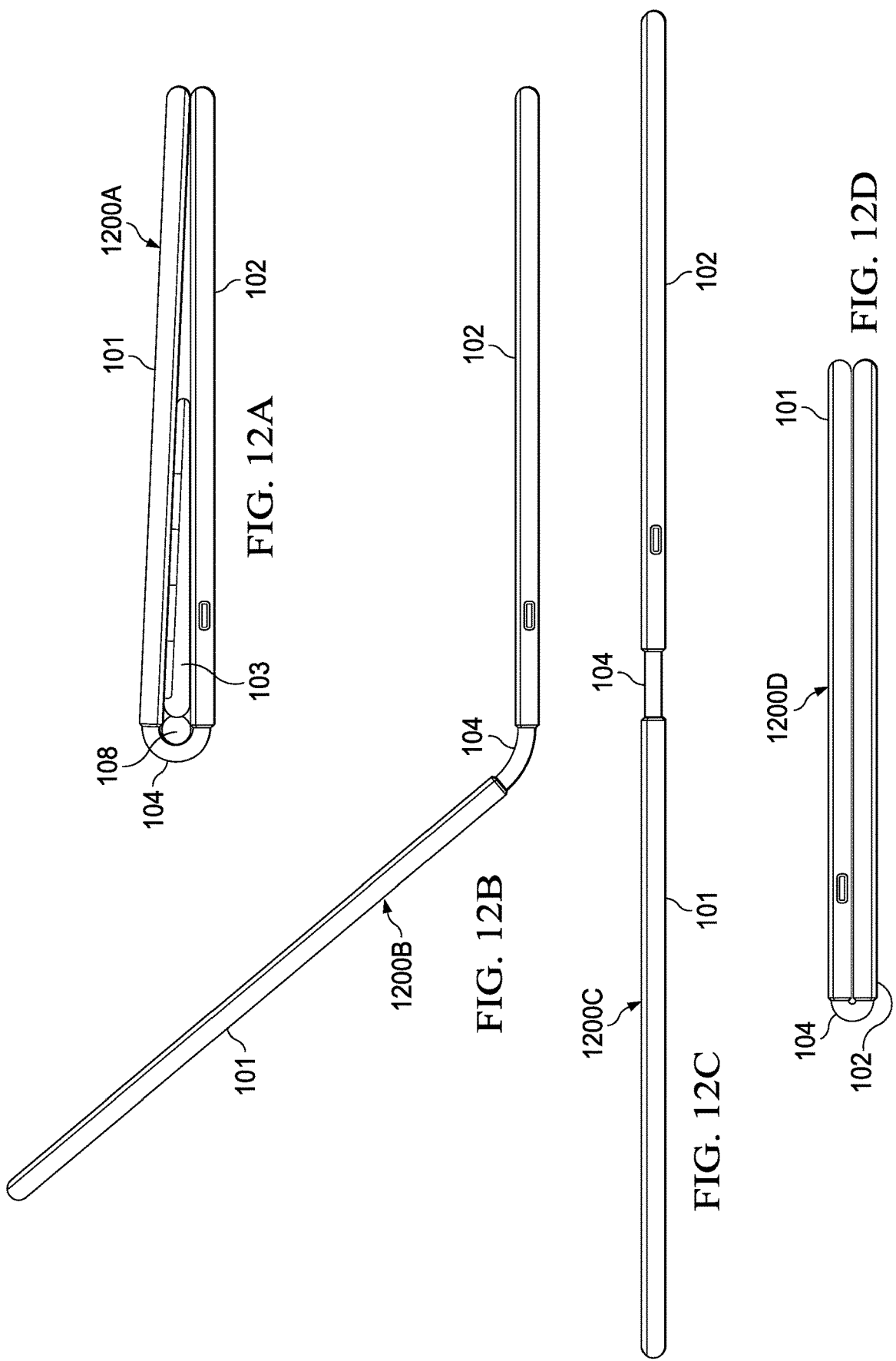

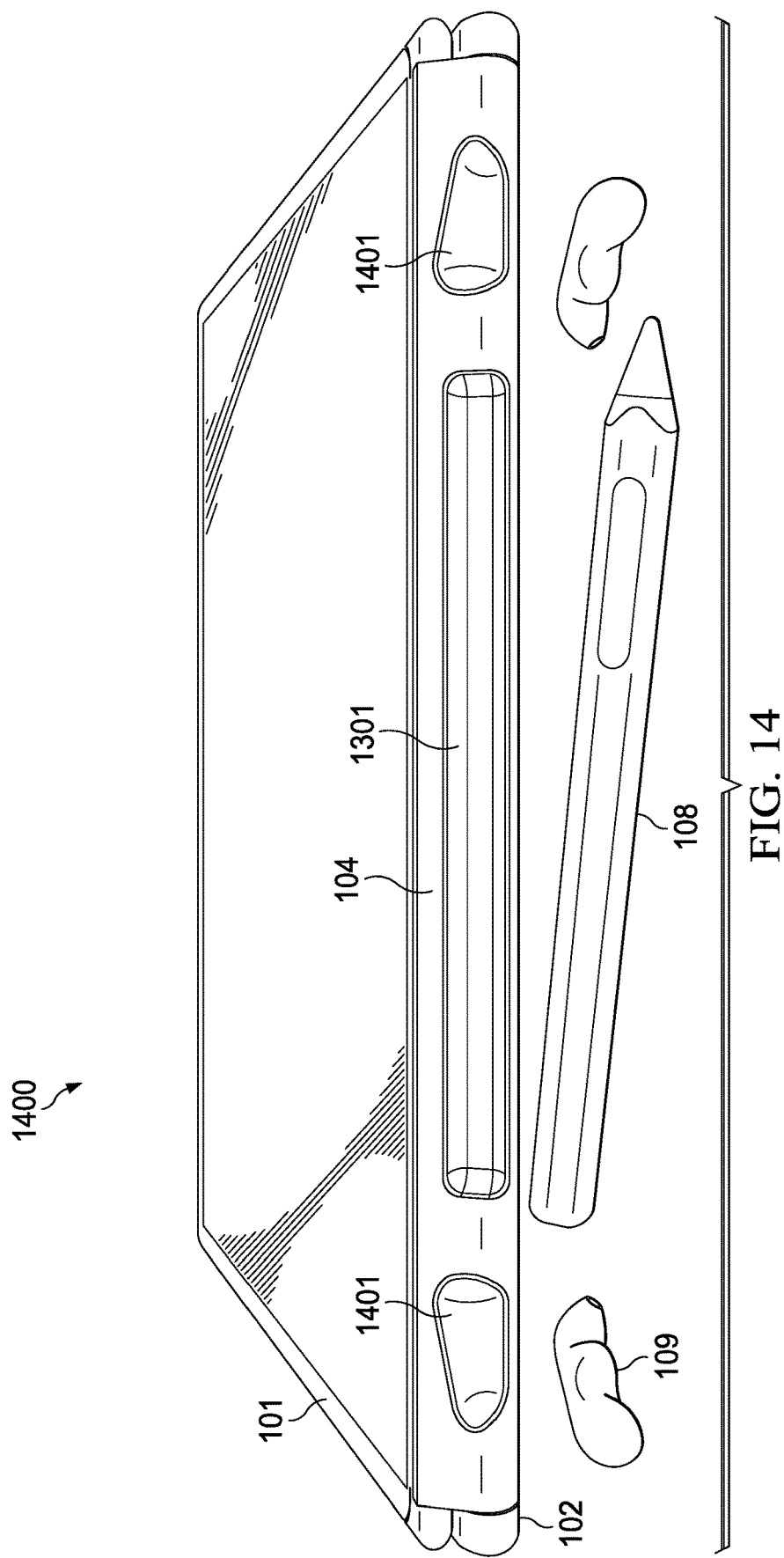

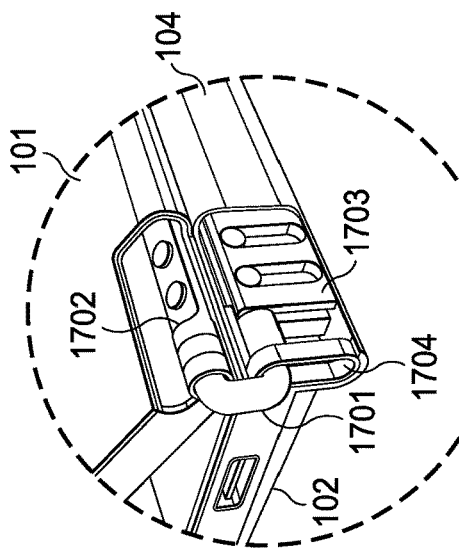
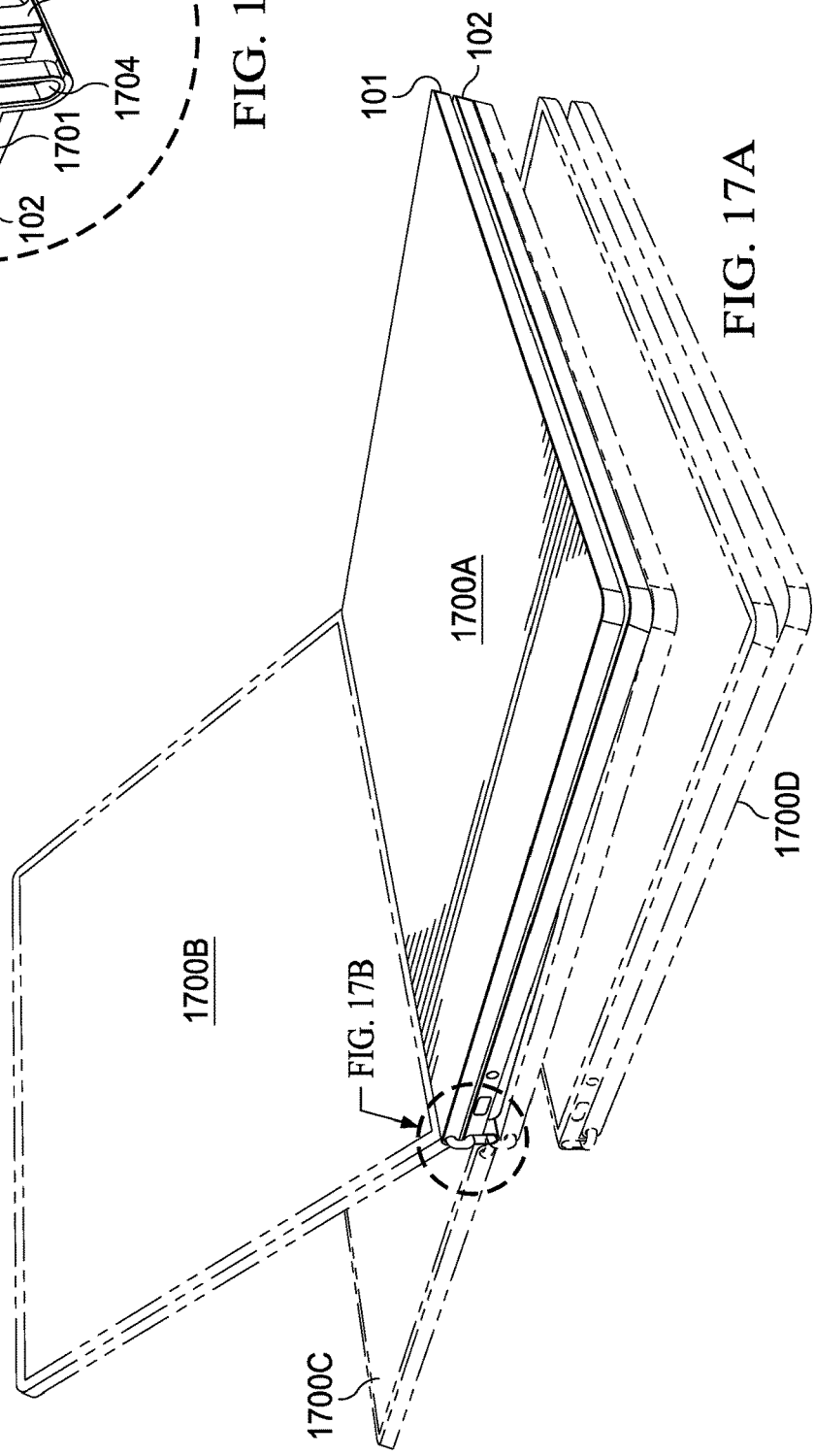

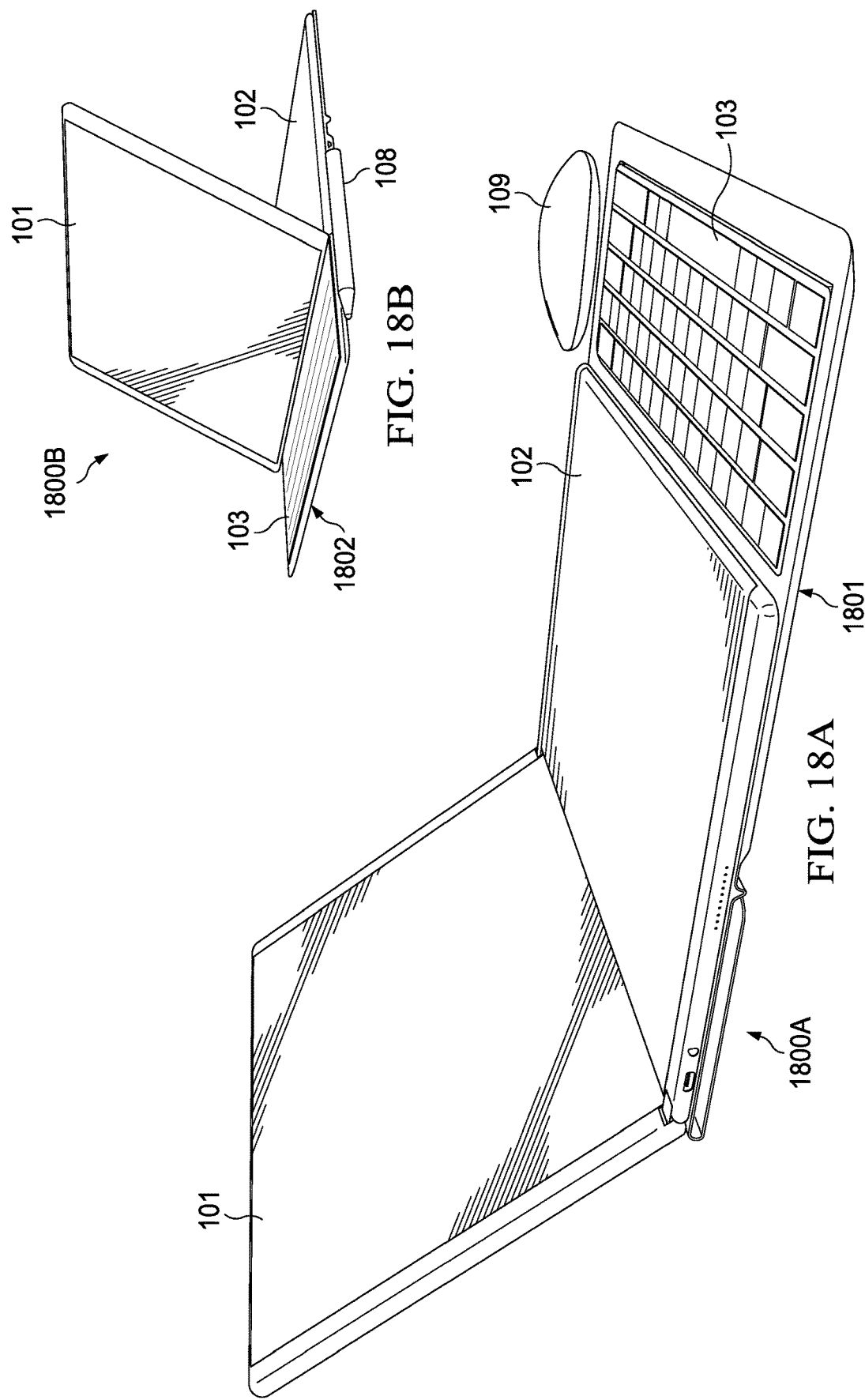

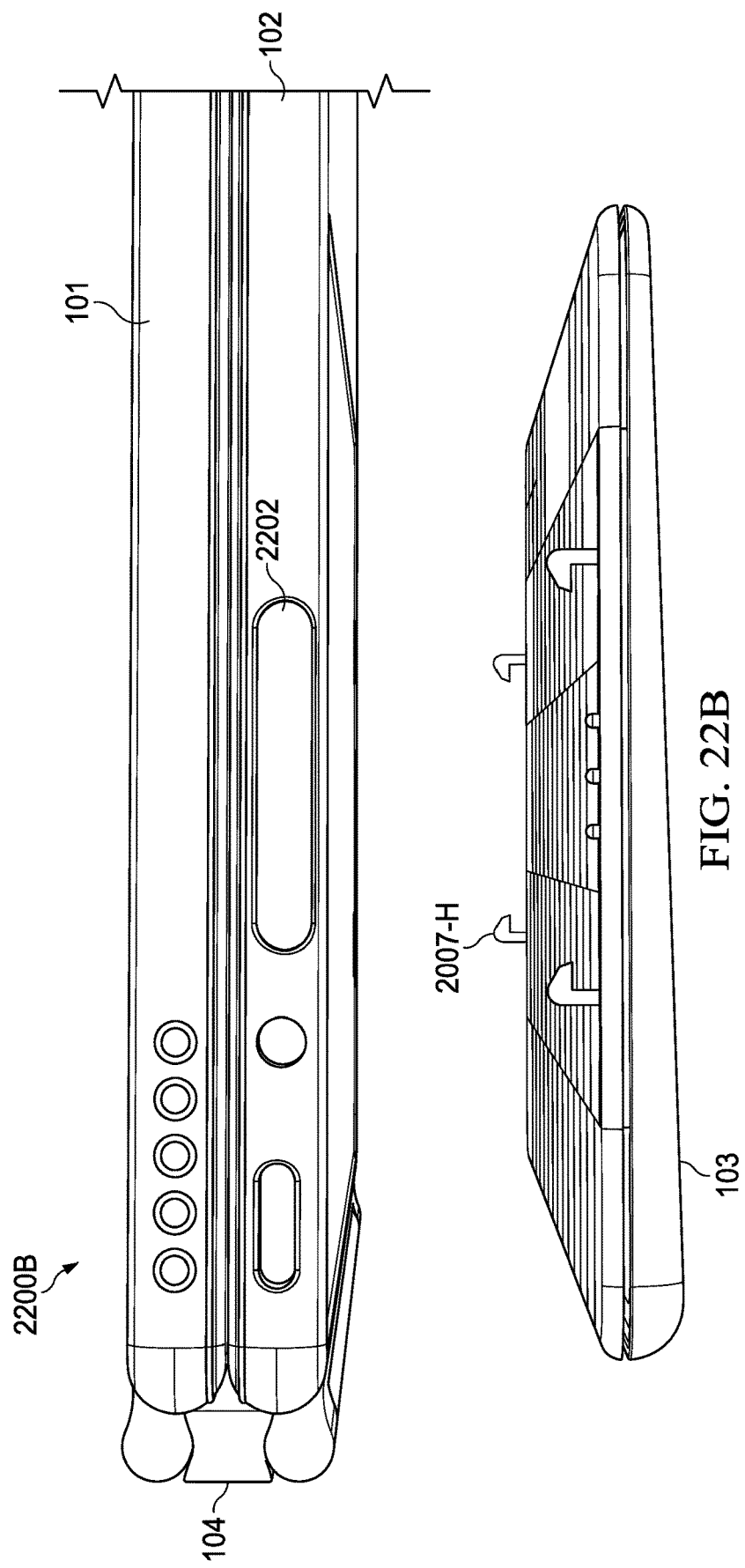

US 10,852,773 B2

MULTI-FORM FACTOR INFORMATION HANDLING SYSTEM (IHS) WITH AN ACCESSORY BACKPACK

FIELD

This disclosure relates generally to Information Handling Systems (IHSs), and more specifically, to a multi-form factor IHS with an accessory backpack.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Nowadays, users can choose among many different types of mobile IHS devices. Each type of device (e.g., tablets, 2-in-1s, mobile workstations, notebooks, netbooks, ultrabooks, etc.) has unique portability, performance, and usability features; however, each also has its own trade-offs and limitations. For example, tablets have less compute power than notebooks and workstations, while notebooks and workstations lack the portability of tablets. A conventional 2-in-1 device combines the portability of a tablet with the performance of a notebook, but with a small display—an uncomfortable form factor in many use-cases.

The inventors hereof have determined that, as productivity continues to be a core tenet of modern computing, mobile IHS devices should provide versatility for many use-cases and display postures in use today (e.g., tablet mode, laptop mode, etc.), as well as future display postures (e.g., digital notebooks, new work surfaces, etc.). Additionally, mobile IHS devices should provide larger display area with reduced size and weight.

SUMMARY

Embodiments of a multi-form factor Information Handling System (IHS) with an accessory backpack are described. In an illustrative, non-limiting embodiment, an IHS may include a first display and a second display coupled to the first display, where the second display comprises a catch, and where the catch is configured to magnetically engage a corresponding hook of an accessory in response to a top surface of the accessory being placed under a back portion of the second display. For example, the accessory may be a keyboard, a battery, or the like.

The IHS may also include: a first set of catches alongside a first short side of the second display; a first set of hooks alongside a first short side of the accessory, where each catch of the first set of catches is configured to magnetically engage a corresponding hook of the first set of hooks; a second set of catches alongside a second short side of the second display; and a second set of hooks alongside a second short side of the accessory, where each catch of the second set of catches is configured to magnetically engage a corresponding hook of the second set of hooks.

The first and second sets of catches may be positioned alongside the short sides of the second display at locations that enable rendering, in response to the accessory being placed atop the second display, of: a first User Interface (UI) feature, in a display area above a first long side of the accessory, in response to the accessory being placed atop the display surface; and a second UI feature in another display area below a second long side of the accessory, in response to the accessory being placed atop the display surface.

The IHS may include an electrical charging port located between the first and second sets of catches, the electrical charging port configured to charge the accessory in response to the accessory being coupled to the second display. The IHS may also include an actuator configured to translate the catch at least until it releases the hook. The hook may be spring-loaded to a disengaged position within the accessory in response to the actuator. Additionally, or alternatively, the hook may be magnetized with an opposite polarity than a polarity of the catch.

In another illustrative, non-limiting embodiment, a method may include attaching an accessory to an IHS having a first display and a second display coupled to the first display, where the second display comprises a catch, and where the catch is configured to magnetically engage a corresponding hook of the accessory in response to a top surface of the accessory being placed under a back portion of the second display; and detaching the accessory from the IHS. In yet another illustrative, non-limiting embodiment, a hardware memory device may have program instructions stored thereon that, upon execution by a processor of an IHS having a first display coupled to a second display, cause the IHS to: determine that a top surface of an accessory is placed under a back portion of the second display; and charge the accessory in response to the determination.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIGS. 10A-C and 11A-C illustrate various use-cases, according to some embodiments.

FIGS. 12A-D, 13A, and 13B illustrate a first hinge implementation and a second hinge implementation, respectively, according to some embodiments.

FIG. 14 illustrates an accessory charging system, according to some embodiments.

FIGS. 15, 16A-C, 17A, and 17B illustrate a third hinge implementation, a fourth hinge implementation, and a fifth hinge implementation, respectively, according to some embodiments.

FIGS. 18A and 18B illustrate a folio case system, according to some embodiments.

FIGS. 22A and 22B illustrate operation of the accessory backpack, according to some embodiments.

DETAILED DESCRIPTION

Embodiments described herein provide a multi-form factor Information Handling System (IHS) with an accessory backpack. In various implementations, a mobile IHS device may include a dual-display, foldable IHS. Each display may include, for example, a Liquid Crystal Display (LCD), Organic Light-Emitting Diode (OLED), or Active Matrix OLED (AMOLED) panel or film, equipped with a touchscreen configured to receive touch inputs. The dual-display, foldable IHS may be configured by a user in any of a number of display postures, including, but not limited to: laptop, tablet, book, clipboard, stand, tent, and/or display.

A user may operate the dual-display, foldable IHS in various modes using a virtual, On-Screen Keyboard (OSK), or a removable, physical keyboard. In some use cases, a physical keyboard may be placed atop at least one of the screens to enable use of the IHS as a laptop, with additional User Interface (UI) features (e.g., virtual keys, touch input areas, etc.) made available via the underlying display, around the keyboard. In other use cases, the physical keyboard may be placed in front of the IHS to expose a larger display area. The user may also rotate the dual-display, foldable IHS, to further enable different modalities with the use of the physical keyboard. In some cases, when not in use, the physical keyboard may be placed or stored inside the dual-display, foldable IHS.

Figure 1:
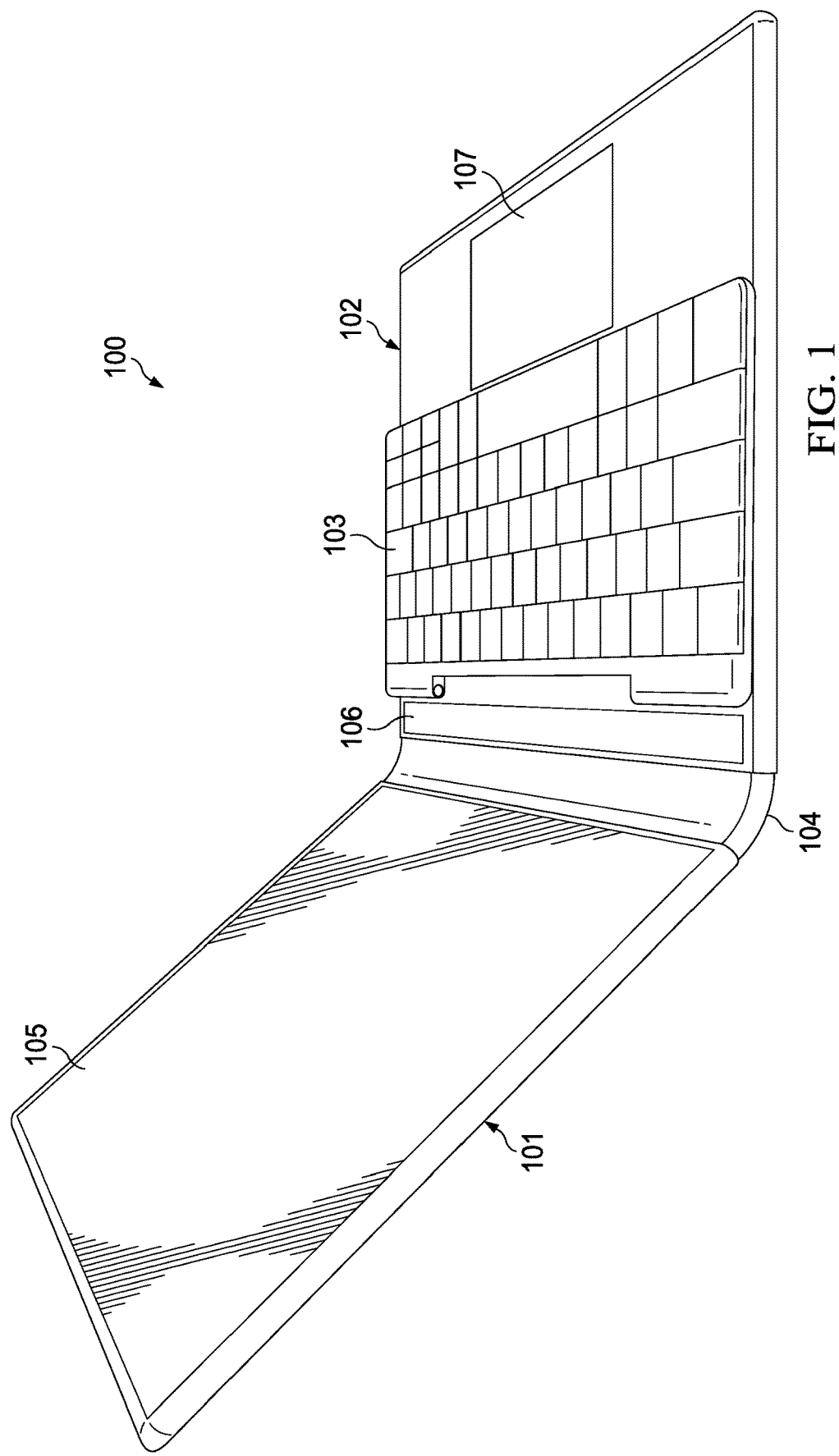
FIG. 1 is a perspective view of a multi-form factor Information Handling System (IHS) with a removable keyboard, according to some embodiments.

FIG. 1 is a perspective view of multi-form factor Information Handling System (IHS) 100 with removable keyboard 103. As shown, first display 101 is coupled to second display 102 via hinge 104, and keyboard 103 sits atop second display 102. The current physical arrangement of first display 101 and second display 102 creates a laptop posture, such that first display 101 becomes primary display area 105 presented by IHS 100, where video or display frames may be rendered for viewing by a user.

In operation, in this particular laptop posture, second display 102 may sit horizontally on a work surface with its display surface facing up, and keyboard 103 may be positioned on top of second display 102, occluding a part of its display surface. In response to this posture and keyboard position, IHS 100 may dynamically produce a first UI feature in the form of at least one configurable secondary display area 106 (a "ribbon area" or "touch bar"), and/or a second UI feature in the form of at least one configurable touch input area 107 (a "virtual trackpad"), using the touchscreen of second display 102.

To identify a current posture of IHS 100 and a current physical relationship or spacial arrangement (e.g., distance, position, speed, etc.) between display(s) 101/102 and keyboard 103, IHS 100 may be configured to use one or more sensors disposed in first display 101, second display 102, keyboard 103, and/or hinge 104. Based upon readings from these various sensors, IHS 100 may then select, configure, modify, and/or provide (e.g., content, size, position, etc.) one or more UI features.

In various embodiments, displays 101 and 102 may be coupled to each other via hinge 104 to thereby assume a plurality of different postures, including, but not limited, to: laptop, tablet, book, or display.

When display 102 is disposed horizontally in laptop posture, keyboard 103 may be placed on top of display 102, thus resulting in a first set of UI features (e.g., ribbon area or touch bar 106, and/or touchpad 107). Otherwise, with IHS 100 still in the laptop posture, keyboard 103 may be placed next to display 102, resulting in a second set of UI features.

As used herein, the term "ribbon area" or "touch bar" 106 refers to a dynamic horizontal or vertical strip of selectable and/or scrollable items, which may be dynamically selected for display and/or IHS control depending upon a present context, use-case, or application. For example, when IHS 100 is executing a web browser, ribbon area or touch bar 106 may show navigation controls and favorite websites. Then, when IHS 100 operates a mail application, ribbon area or touch bar 106 may display mail actions, such as replying or flagging. In some cases, at least a portion of ribbon area or touch bar 106 may be provided in the form of a stationary control strip, providing access to system features such as brightness and volume. Additionally, or alternatively, ribbon area or touch bar 106 may enable multitouch, to support two or more simultaneous inputs.

In some cases, ribbon area 106 may change position, location, or size if keyboard 103 is moved alongside a lateral or short edge of second display 102 (e.g., from horizontally displayed alongside a long side of keyboard 103 to being vertically displayed alongside a short side of keyboard 103). Also, the entire display surface of display 102 may show rendered video frames if keyboard 103 is moved alongside the bottom or long edge of display 102. Conversely, if keyboard 103 is removed of turned off, yet another set of UI features, such as an OSK, may be provided via display(s) 101/102. As such, in many embodiments, the distance and/or relative position between keyboard 103 and display(s) 101/102 may be used to control various aspects the UI.

During operation, the user may open, close, flip, swivel, or rotate either of displays 101 and/or 102, via hinge 104, to produce different postures. In each posture, a different arrangement between IHS 100 and keyboard 103 results in different UI features being presented or made available to the user. For example, when second display 102 is folded against display 101 so that the two displays have their backs against each other, IHS 100 may be said to have assumed a tablet posture (e.g., FIG. 7G) or book posture (e.g., FIG. 8D), depending upon whether IHS 100 is stationary, moving, horizontal, resting at a different angle, and/or its orientation (landscape vs. portrait).

In many of these scenarios, placement of keyboard 103 upon or near display(s) 101/102, and subsequent movement or removal, may result in a different set of UI features than when IHS 100 is in laptop posture.

In many implementations, different types of hinges 104 may be used to achieve and maintain different display postures, and to support different keyboard arrangements. Examples of suitable hinges 104 include, but are not limited to: a 360-hinge (FIGS. 12A-D), a jaws hinge (FIGS. 13A and 13B), a yoga hinge (FIG. 15), a gear hinge (FIGS. 16A-C), and a slide hinge (FIGS. 17A and 17B). One or more of these hinges 104 may include wells or compartments (FIG. 14) for docking, cradling, charging, or storing accessories. Moreover, one or more aspects of hinge 104 may be monitored via one or more sensors (e.g., to determine whether an accessory is charging) when controlling the different UI features.

In some cases, a folio case system (FIGS. 18A and 18B) may be used to facilitate keyboard arrangements. Additionally, or alternatively, an accessory backpack system (FIG. 19) may be used to hold keyboard 103 and/or an extra battery or accessory.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 2:
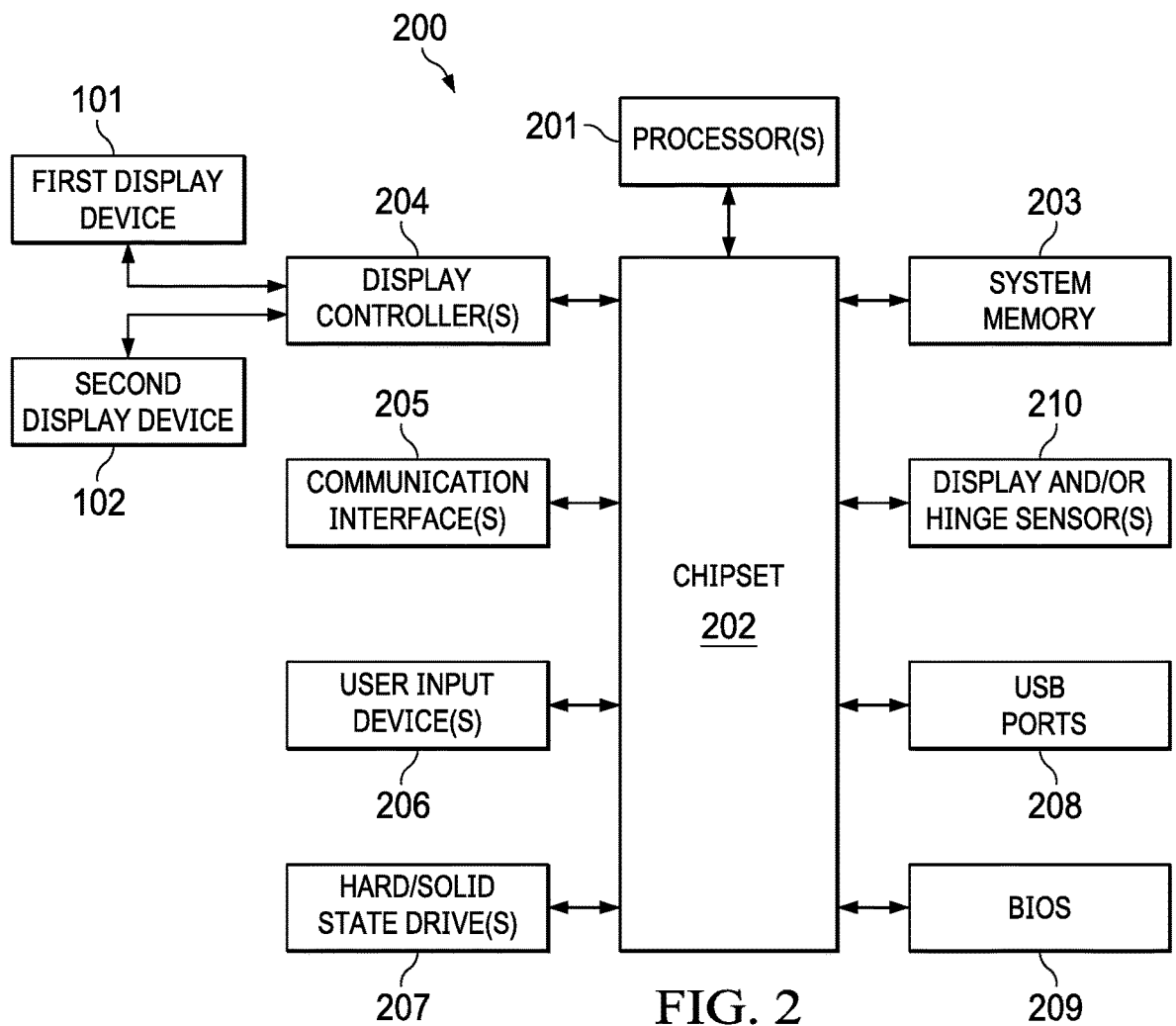
FIGS. 2 and 3 are block diagrams of components of the multi-form factor IHS and removable keyboard, respectively, according to some embodiments.

FIG. 2 is a block diagram of components 200 of multi-form factor IHS 100. As depicted, components 200 include processor 201. In various embodiments, IHS 100 may be a single-processor system, or a multi-processor system including two or more processors. Processor 201 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes chipset 202 coupled to processor 201. In certain embodiments, chipset 202 may utilize a QuickPath Interconnect (QPI) bus to communicate with processor 201. In various embodiments, chipset 202 may provide processor 201 with access to a number of resources. Moreover, chipset 202 may be coupled to communication interface(s) 205 to enable communications via various wired and/or wireless networks, such as Ethernet, WiFi, BLUETOOTH, cellular or mobile networks (e.g., CDMA, TDMA, LTE, etc.), satellite networks, or the like. For example, communication interface(s) 205 may be coupled to chipset 202 via a PCIe bus.

Chipset 202 may be coupled to display controller(s) 204, which may include one or more or graphics processor(s) (GPUs) on a graphics bus, such as an Accelerated Graphics Port (AGP) or Peripheral Component Interconnect Express (PCIe) bus. As shown, display controller(s) 204 provide video or display signals to first display device 101 and second display device 202. In other implementations, any number of display controller(s) 204 and/or display devices 101/102 may be used.

Each of display devices 101 and 102 may include a flexible display that is deformable (e.g., bent, folded, rolled, or stretched) by an external force applied thereto. For example, display devices 101 and 102 may include LCD, OLED, or AMOLED, plasma, electrophoretic, or electrowetting panel(s) or film(s). Each display device 101 and 102 may include a plurality of pixels arranged in a matrix, configured to display visual information, such as text, two-dimensional images, video, three-dimensional images, etc.

Display device(s) 101/102 may be configured to sense haptic and/or physical touch events, and to generate touch information. To this end, display device(s) 101/102 may include a touchscreen matrix (e.g., a layered capacitive panel or the like) and/or touch controller configured to receive and interpret multi-touch gestures from a user touching the screen with a stylus or one or more fingers. In some cases, display and touch control aspects of display device(s) 101/102 may be collectively operated and controlled by display controller(s) 204.

In some cases, display device(s) 101/102 may also comprise a deformation or bending sensor configured to generate deformation or bending information including, but not limited to: the bending position of a display (e.g., in the form of a "bending line" connecting two or more positions at which bending is detected on the display), bending direction, bending angle, bending speed, etc. In these implementations, display device(s) 101/102 may be provided as a single continuous display, rather than two discrete displays.

Chipset 202 may also provide processor 201 and/or display controller(s) 204 with access to memory 203. In various embodiments, system memory 203 may be implemented using any suitable memory technology, such as static RAM (SRAM), dynamic RAM (DRAM) or magnetic disks, or any nonvolatile/Flash-type memory, such as a solid-state drive (SSD) or the like. Memory 203 may store program instructions that, upon execution by processor 201 and/or controller(s) 204, present a UI interface to a user of IHS 100.

Chipset 202 may further provide access to one or more hard disk and/or solid-state drives 207. In certain embodiments, chipset 202 may also provide access to one or more optical drives or other removable-media drives. In certain embodiments, chipset 202 may also provide access to one or more Universal Serial Bus (USB) ports 208.

Upon booting of IHS 100, processor(s) 201 may utilize Basic Input/Output System (BIOS) 209 instructions to initialize and test hardware components coupled to IHS 100 and to load an Operating System (OS) for use by IHS 100. BIOS 209 provides an abstraction layer that allows the OS to interface with certain hardware components that are utilized by IHS 100. Via the hardware abstraction layer provided by BIOS 209, software stored in memory 203 and executed by the processor(s) 201 of IHS 100 is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Chipset 202 may also provide access to one or more user input devices 206, for example, using a super I/O controller or the like. For instance, chipset 202 may provide access to a keyboard (e.g., keyboard 103), mouse, trackpad, stylus, totem, or any other peripheral input device, including touchscreen displays 101 and 102. These input devices may interface with chipset 202 through wired connections (e.g., in the case of touch inputs received via display controller(s) 204) or wireless connections (e.g., via communication interfaces(s) 205). In some cases, chipset 202 may be used to interface with user input devices such as keypads, biometric scanning devices, and voice or optical recognition devices.

In certain embodiments, chipset 202 may also provide an interface for communications with one or more sensors 210. Sensors 210 may be disposed within displays 101/102 and/or hinge 104, and may include, but are not limited to: electric, magnetic, radio, optical, infrared, thermal, force, pressure, acoustic, ultrasonic, proximity, position, deformation, bending, direction, movement, velocity, rotation, and/or acceleration sensor(s).

Figure 3:
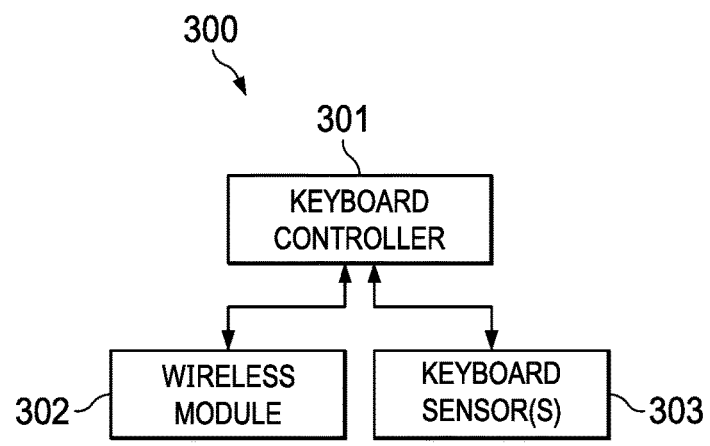

FIG. 3 is a block diagram of components 300 of keyboard IHS 103. As depicted, components 300 include keyboard controller or processor 301, coupled to keyboard sensor(s) 303 and wireless communication module 302. In various embodiments, keyboard controller 301 may be configured to detect keystrokes made by user upon a keyboard matrix, and it may transmit those keystrokes to IHS 100 via wireless module 302 using a suitable protocol (e.g., BLUETOOTH). Keyboard sensors 303, which may also include any of the aforementioned types of sensor(s), may be disposed under keys and/or around the keyboard's enclosure, to provide information regarding the location, arrangement, or status of keyboard 103 to IHS 100 via wireless module 302.

In various embodiments, IHS 100 and/or keyboard 103 may not include all of components 200 and/or 300 shown in FIGS. 2 and 3, respectively. Additionally, or alternatively, IHS 100 and/or keyboard 103 may include components in addition to those shown in FIGS. 2 and 3, respectively. Additionally, or alternatively, components 200 and/or 300, represented as discrete in FIGS. 2 and 3, may be integrated with other components. For example, all or a portion of the functionality provided by components 200 and/or 300 may be provided as a System-On-Chip (SOC), or the like.

Figure 4:
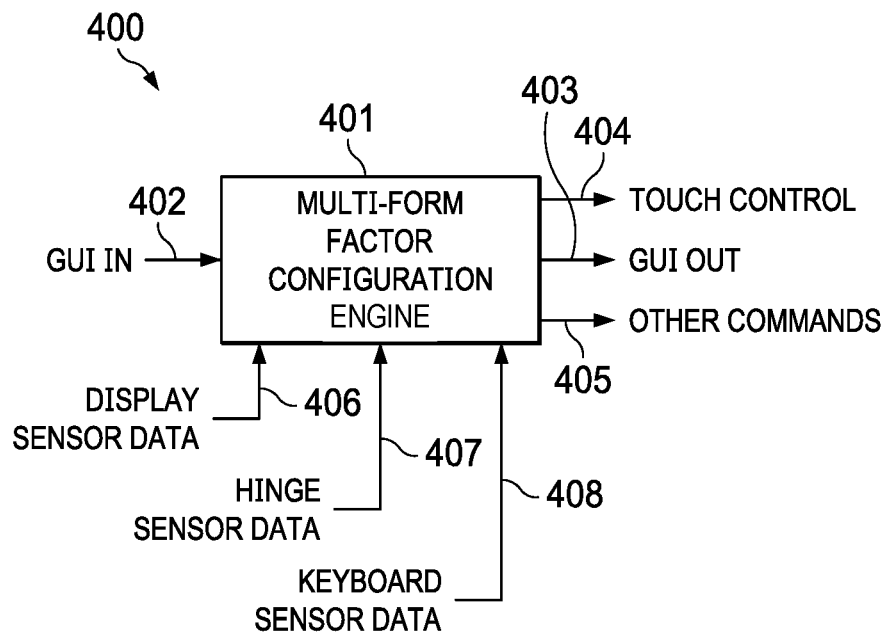
FIG. 4 is a block diagram of a multi-form factor configuration engine, according to some embodiments.

FIG. 4 is a block diagram of multi-form factor configuration engine 401. Particularly, multi-form factor configuration engine 401 may include electronic circuits and/or program instructions that, upon execution, cause IHS 100 to perform a number of operation(s) and/or method(s) described herein.

In various implementations, program instructions for executing multi-form factor configuration engine 401 may be stored in memory 203. For example, engine 401 may include one or more standalone software applications, drivers, libraries, or toolkits, accessible via an Application Programming Interface (API) or the like. Additionally, or alternatively, multi-form factor configuration engine 401 may be included the IHS's OS.

In other embodiments, however, multi-form factor configuration engine 401 may be implemented in firmware and/or executed by a co-processor or dedicated controller, such as a Baseband Management Controller (BMC), or the like.

As illustrated, multi-form factor configuration engine 401 receives Graphical User Interface (GUI) input or feature 402, and produces GUI output or feature 403, in response to receiving and processing one or more or: display sensor data 406, hinge sensor data 407, and/or keyboard sensor data 408. Additionally, or alternatively, multi-form factor configuration engine 401 may produce touch control feature 404 and/or other commands 405.

In various embodiments, GUI input 402 may include one or more images to be rendered on display(s) 101/102, and/or one or more entire or partial video frames. Conversely, GUI output 403 may include one or more modified images (e.g., different size, color, position on the display, etc.) to be rendered on display(s) 101/102, and/or one or more modified entire or partial video frames.

For instance, in response to detecting, via display and/or hinge sensors 406/407, that IHS 100 has assumed a laptop posture from a closed or "off" posture, GUI OUT 403 may allow a full-screen desktop image, received as GUI IN 402, to be displayed first display 101 while second display 102 remains turned off or darkened. Upon receiving keyboard sensor data 408 indicating that keyboard 103 has been positioned over second display 102, GUI OUT 403 may produce a ribbon-type display or area 106 around the edge(s) of keyboard 103, for example, with interactive and/or touch selectable virtual keys, icons, menu options, pallets, etc. If keyboard sensor data 408 then indicates that keyboard 103 has been turned off, for example, GUI OUT 403 may produce an OSK on second display 102.

Additionally, or alternatively, touch control feature 404 may be produced to visually delineate touch input area 107 of second display 102, to enable its operation as a user input device, and to thereby provide an UI interface commensurate with a laptop posture. Touch control feature 404 may turn palm or touch rejection on or off in selected parts of display(s) 101/102. Also, GUI OUT 403 may include a visual outline displayed by second display 102 around touch input area 107, such that palm or touch rejection is applied outside of the outlined area, but the interior of area 107 operates as a virtual trackpad on second display 102.

Multi-form factor configuration engine 401 may also produce other commands 405 in response to changes in display posture and/or keyboard state or arrangement, such as commands to turn displays 101/102 on or off, enter a selected power mode, charge or monitor a status of an accessory device (e.g., docked in hinge 104), etc.

Figure 5:
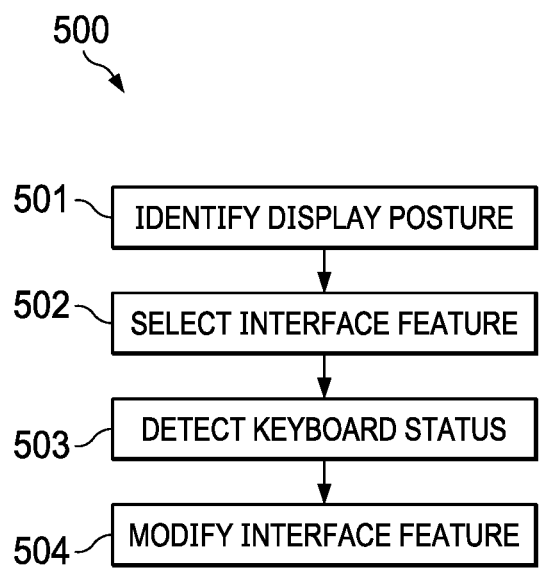
FIG. 5 is a flowchart of a method for configuring multi-form factor IHSs, according to some embodiments.

FIG. 5 is a flowchart of method 500 for configuring multi-form factor IHSs. In various embodiments, method 500 may be performed by multi-form factor configuration engine 401 under execution of processor 201. At block 501, method 500 includes identifying a display posture—that is, a relative physical arrangement between first display 101 and second display 102. For example, block 501 may use sensor data received from displays 101/102 and/or hinge 104 to distinguish among the various postures shown below.

At block 502, method 500 selects a UI feature corresponding to the identified posture. Examples of UI features include, but are not limited to: turning a display on or off; displaying a full or partial screen GUI; displaying a ribbon area; providing a virtual trackpad area; altering touch control or palm rejection settings; adjusting the brightness and contrast of a display; selecting a mode, volume, and/or or directionality of audio reproduction; etc.

At block 503, method 500 may detect the status of keyboard 103. For example, block 503 may determine that keyboard 103 is on or off, resting between two closed displays, horizontally sitting atop display(s) 101/102, or next to display(s) 101/102. Additionally, or alternatively, block 503 may determine the location or position of keyboard 103 relative to display 102, for example, using Cartesian coordinates. Additionally, or alternatively, block 503 may determine an angle between keyboard 103 and displays 101/102 (e.g., a straight angle if display 102 is horizontal, or a right angle if display 102 is vertical).

Then, at block 504, method 500 may modify the UI feature in response to the status of keyboard 103. For instance, block 504 may cause a display to turn on or off, it may change the size or position of a full or partial screen GUI or a ribbon area, it may change the size or location of a trackpad area with changes to control or palm rejection settings, etc. Additionally, or alternatively, block 504 may produce a new interface feature or remove an existing feature, associated with a display posture, in response to any aspect of the keyboard status meeting a selected threshold of falling within a defined range of values.

FIGS. 6A-C, 7A-J, 8A-D, and 9A-F illustrate examples of laptop, tablet, book, and display postures which may be detected by operation of block 501 of method 500 during execution of multi-form factor configuration engine 401 by IHS 100.

Figure 6A:
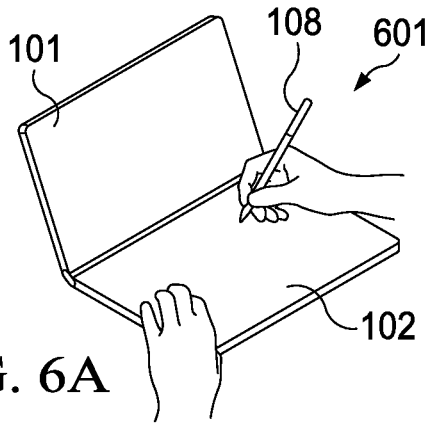
FIGS. 6A-C, 7A-J, 8A-D, and 9A-F illustrate examples of laptop, tablet, book, and display postures, respectively, according to some embodiments.
Figure 6B:
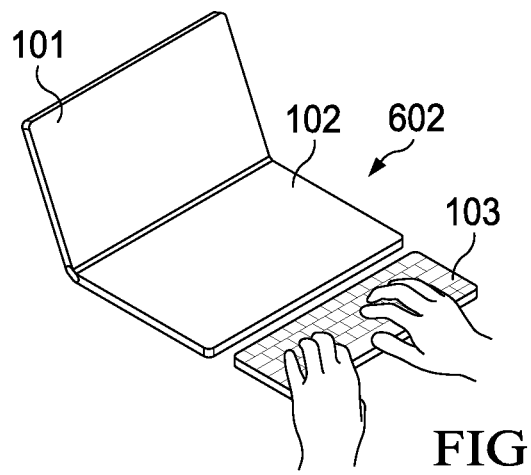
Figure 6C:
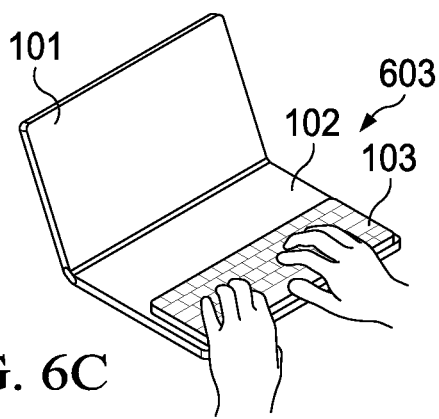

Particularly, FIGS. 6A-C show a laptop posture, where a first display surface of first display 101 is facing the user at an obtuse angle with respect to a second display surface of second display 102, and such that second display 102 is disposed in a horizontal position, with the second display surface facing up. In FIG. 6A, state 601 shows a user operating IHS 100 with a stylus or touch on second display 102. In FIG. 6B, state 602 shows IHS 100 with keyboard 103 positioned off the bottom edge or long side of second display 102, and in FIG. 6C, state 603 shows the user operating keyboard 103 atop second display 102.

Figure 7A:
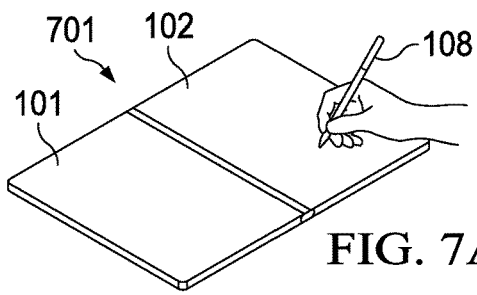
Figure 7B:
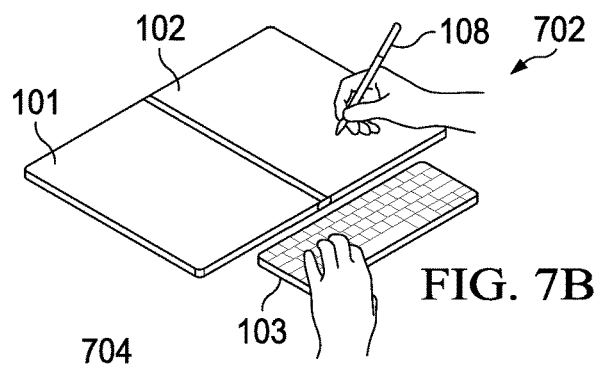
Figure 7C:
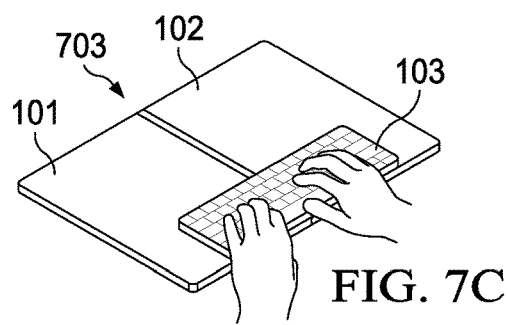
Figure 7D:
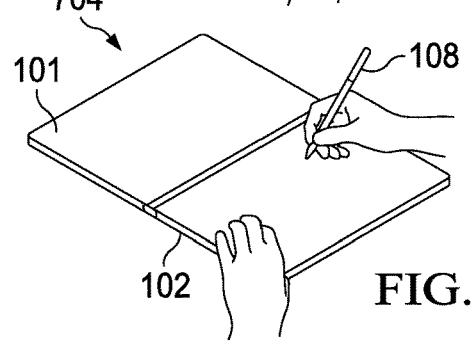
Figure 7E:
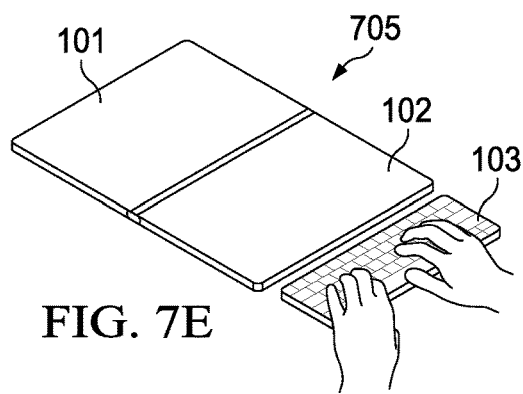
Figure 7F:
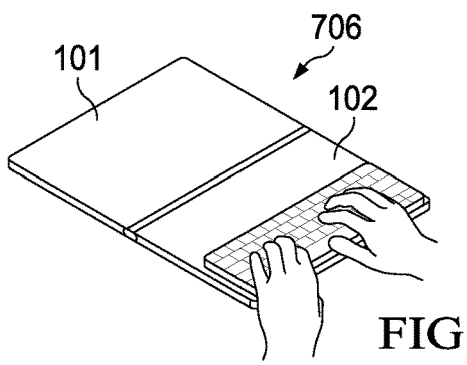

FIGS. 7A-J show a tablet posture, where first display 101 is at a straight angle with respect to second display 102, such that first and second displays 101 and 102 are disposed in a horizontal position, with the first and second display surfaces facing up. Specifically, FIG. 7A shows state 701 where IHS 100 is in a side-by-side, portrait orientation without keyboard 103, FIG. 7B shows state 702 where keyboard 103 is being used off the bottom edges or short sides of display(s) 101/102, and FIG. 7C shows state 703 where keyboard 103 is located over both displays 101 and 102. In FIG. 7D, state 704 shows IHS 100 in a side-by-side, landscape configuration without keyboard 103, in FIG. 7E state 705 shows keyboard 103 being used off the bottom edge or long side of second display 102, and in FIG. 7F state 706 shows keyboard 103 on top of second display 102.

Figure 7G:
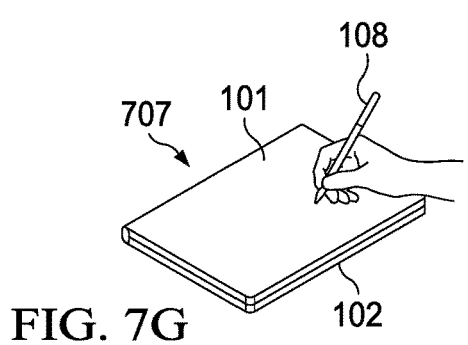
Figure 7H:
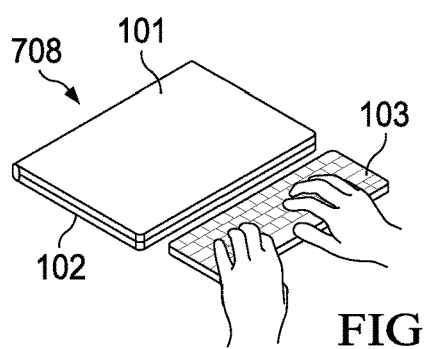
Figure 7I:
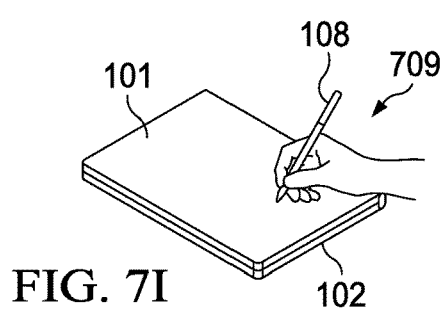
Figure 7J:
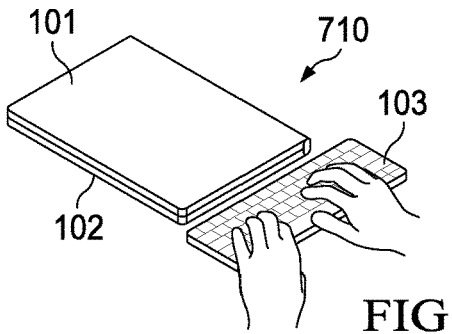

In FIG. 7G, state 707 shows first display 101 rotated around second display 102 via hinge 104 such that the display surface of second display 102 is horizontally facing down, and first display 101 rests back-to-back against second display 102, without keyboard 103; and in FIG. 7H, state 708 shows the same configuration, but with keyboard 103 placed off the bottom or long edge of display 102. In FIGS. 7I and 7J, states 709 and 710 correspond to states 707 and 708, respectively, but with IHS 100 in a portrait orientation.

Figure 8A:
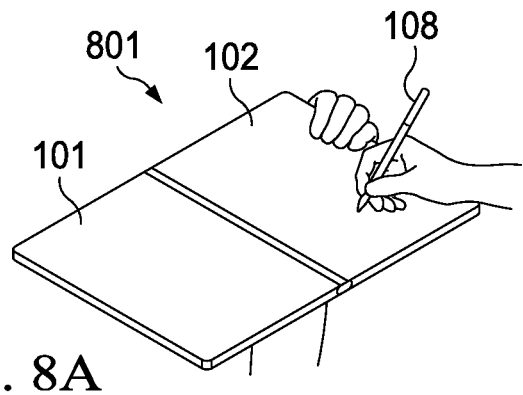
Figure 8B:
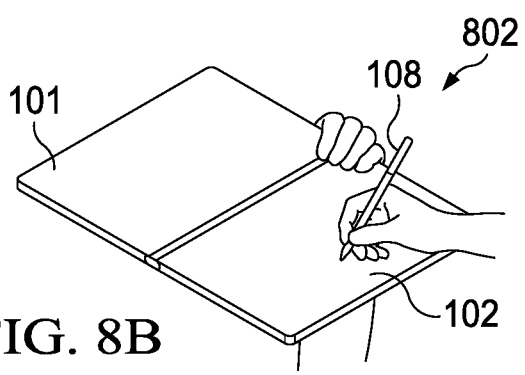
Figure 8C:
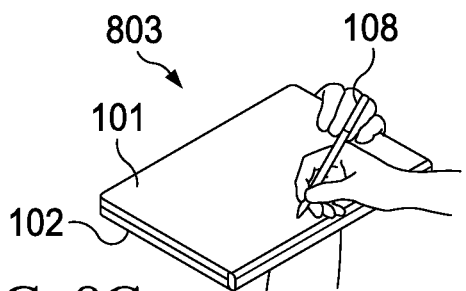
Figure 8D:
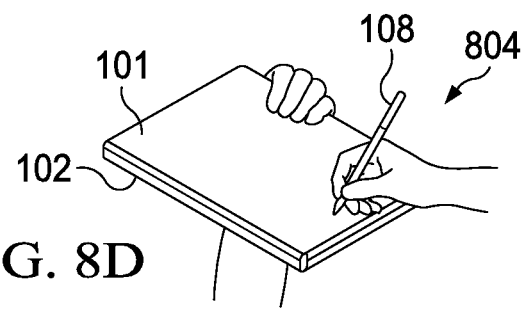

FIG. 8A-D show a book posture, similar to the tablet posture of FIGS. 7A-J, but such that neither one of displays 101 or 102 is horizontally held by the user and/or such that the angle between the display surfaces of the first and second displays 101 and 102 is other than a straight angle. In FIG. 8A, state 801 shows dual-screen use in portrait orientation, in FIG. 8B state 802 shows dual-screen use in landscape orientation, in FIG. 8C state 803 shows single-screen use in landscape orientation, and in FIG. 8D state 804 shows single-screen use in portrait orientation.

Figure 9A:
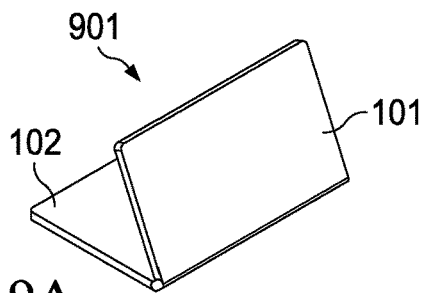
Figure 9B:
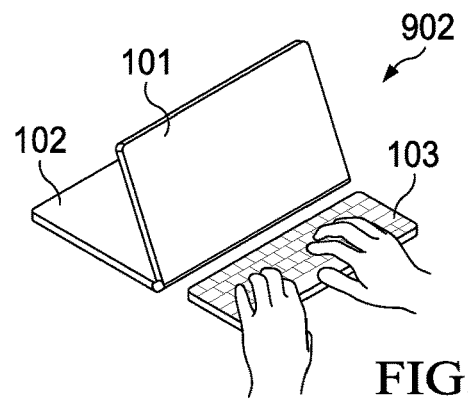
Figure 9C:
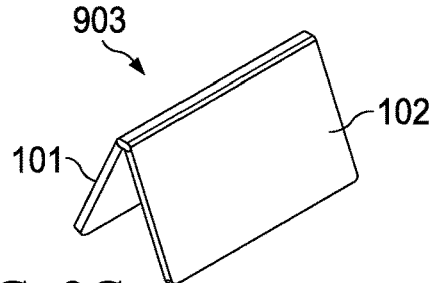
Figure 9D:
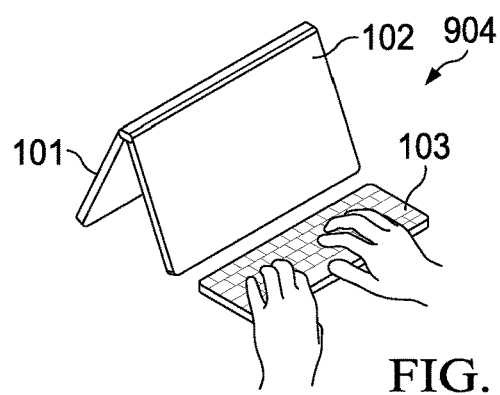
Figure 9E:
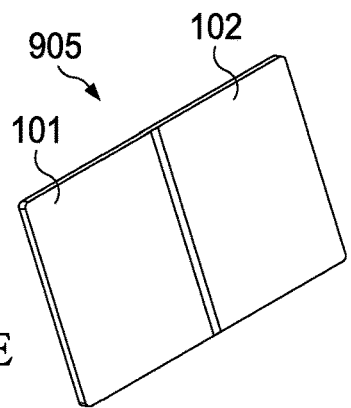
Figure 9F:
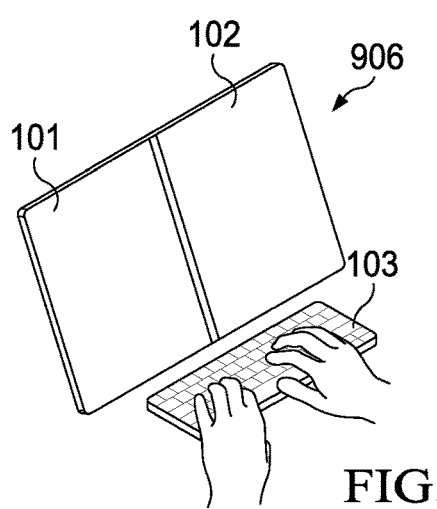

FIGS. 9A-F show a display posture, where first display 100 is at an acute angle with respect to second display 102, and/or where both displays are vertically arranged in a portrait orientation. Particularly, in FIG. 9A state 901 shows a first display surface of first display 102 facing the user and the second display surface of second display 102 horizontally facing down, whereas in FIG. 9B state 902 shows the same configuration but with keyboard 103 used off the bottom edge or long side of display 101. In FIG. 9C, state 903 shows a display posture where display 102 props up display 101 in a stand configuration, and in FIG. 9D, state 904 shows the same configuration but with keyboard 103 used off the bottom edge or long side of display 101. In FIG. 9E, state 905 shows both displays 101 and 102 resting vertically or at display angle, and in FIG. 9F state 906 shows the same configuration but with keyboard 103 used off the bottom edge or long side of display 101.

It should be noted that the aforementioned postures, and their various respective keyboard states, are described for sake of illustration. In different embodiments, however, other postures and keyboard states may be used, for example, depending upon the type of hinge coupling the displays, the number of displays used, or other accessories. For instance, when IHS 100 is chargeable via a charging or docking station, the connector in the docking station may be configured to hold IHS 100 at angle selected to facility one of the foregoing postures (e.g., keyboard states 905 and 906).

FIGS. 10A-C illustrate a first example use-case of method 500 in the context of a laptop posture. In state 1000A of FIG. 10A, first display 101 shows primary display area 1001, keyboard 103 sits atop second display 102, and second display 102 provides UI features such as first ribbon area 1002 (positioned between the top long edge of keyboard 103 and hinge 104) and touch area 1003 (positioned below keyboard 103). As keyboard 103 moves up or down on the surface of display 102, ribbon area 1002 and/or touch area 1003 may dynamically move up or down, or become bigger or smaller, on second display 102. In some cases, when keyboard 103 is removed, a virtual OSK may be rendered (e.g., at that same location) on the display surface of display 102.

In state 1000B of FIG. 10B, in response to execution of method 500 by multi-form factor configuration engine 401, first display 101 continues to show main display area 1001, but keyboard 103 has been moved off of display 102. In response, second display 102 now shows secondary display area 1004 and also second ribbon area 1005. In some cases, second ribbon area 1005 may include the same UI features (e.g., icons, etc.) as also shown in area 1002, but here repositioned to a different location of display 102 nearest the long edge of keyboard 103. Alternatively, the content of second ribbon area 1005 may be different from the content of first ribbon area 1002.

In state 1000C of FIG. 10C, during execution of method 500 by multi-form factor configuration engine 401, IHS 100 detects that physical keyboard 103 has been removed (e.g., out of wireless range) or turned off (e.g., low battery), and in response display 102 produces a different secondary display area 1006 (e.g., smaller than 1004), as well as OSK 1007.

FIGS. 11A-C illustrate a second example use-case of method 500 in the context of a tablet posture. In state 1100A of FIG. 11A, second display 102 has its display surface facing up, and is disposed back-to-back with respect to second display 102, as in states 709/710, but with keyboard 103 sitting atop second display 102. In this state, display 102 provides UI features such primary display area 1101 and first ribbon area 1102, positioned as shown. As keyboard 103 is repositioned up or down on the surface of display 102, display area 1101, first ribbon area 1102, and/or touch area 1103 may also be moved up or down, or made bigger or smaller, by multi-form factor configuration engine 401.

In state 1100B of FIG. 11B, keyboard 103 is detected off of the surface of display 102. In response, first display 101 shows modified main display area 1103 and modified ribbon area 1104. In some cases, modified ribbon area 1104 may include the same UI features as area 1102, but here repositioned to a different location of display 102 nearest the long edge of keyboard 103. Alternatively, the content of second ribbon area 1104 may be different from the content of first ribbon area 1102. In some cases, the content and size of modified ribbon area 1104 may be selected in response to a distance between keyboard 103 and display 102.

In state 1100C of FIG. 11C, during continued execution of method 500, multi-form factor configuration engine 401 detects that physical keyboard 103 has been removed or turned off, and in response display 102 produces yet another display area 1105 (e.g., larger than 1003 or 1002), this time without an OSK.

In various embodiments, the different UI behaviors discussed in the aforementioned use-cases may be set, at least in part, by policy and/or profile, and stored in a preferences database for each user. In this manner, UI features and modifications of blocks 502 and 504, such as whether touch input area 1003 is produced in state 1000A (and/or its size and position on displays 101/102), or such as whether ribbon area 1102 is produced in state 1100A (and/or its size and position on displays 101/102), may be configurable by a user.

FIGS. 12A-D illustrate a 360-hinge implementation, usable as hinge 104 in IHS 100, in four different configurations 1200A-D, respectively. Particularly, 360-hinge 104 may include a plastic, acrylic, polyamide, polycarbonate, elastic, and/or rubber coupling, with one or more internal support, spring, and/or friction mechanisms that enable a user to rotate displays 101 and 102 relative to one another, around the axis of 360-hinge 104.

Hinge configuration 1200A of FIG. 12A may be referred to as a closed posture, where at least a portion of a first display surface of the first display 101 is disposed against at least a portion of a second display surface of the second display 102, such that the space between displays 101/102 accommodates keyboard 103. When display 101 is against display 102, stylus or accessory 108 may be slotted into keyboard 103. In some cases, stylus 108 may have a diameter larger than the height of keyboard 103, so that 360-hinge 104 wraps around a portion of the circumference of stylus 108 and therefore holds keyboard 103 in place between displays 101/102.

Hinge configuration 1200B of FIG. 12B shows a laptop posture between displays 101/102. In this case, 360-hinge 104 holds first display 101 up, at an obtuse angle with respect to first display 101. Meanwhile, hinge configuration 1200C of FIG. 12C shows a tablet, book, or display posture (depending upon the resting angle and/or movement of IHS 100), with 360-hinge 104 holding first and second displays 101/102 at a straight angle (180°) with respect to each other. And hinge configuration 1200D of FIG. 12D shows a tablet or book configuration, with 360-hinge 104 holding first and second displays 101 and 102 at a 360° angle, with their display surfaces in facing opposite directions.

Figure 13A:
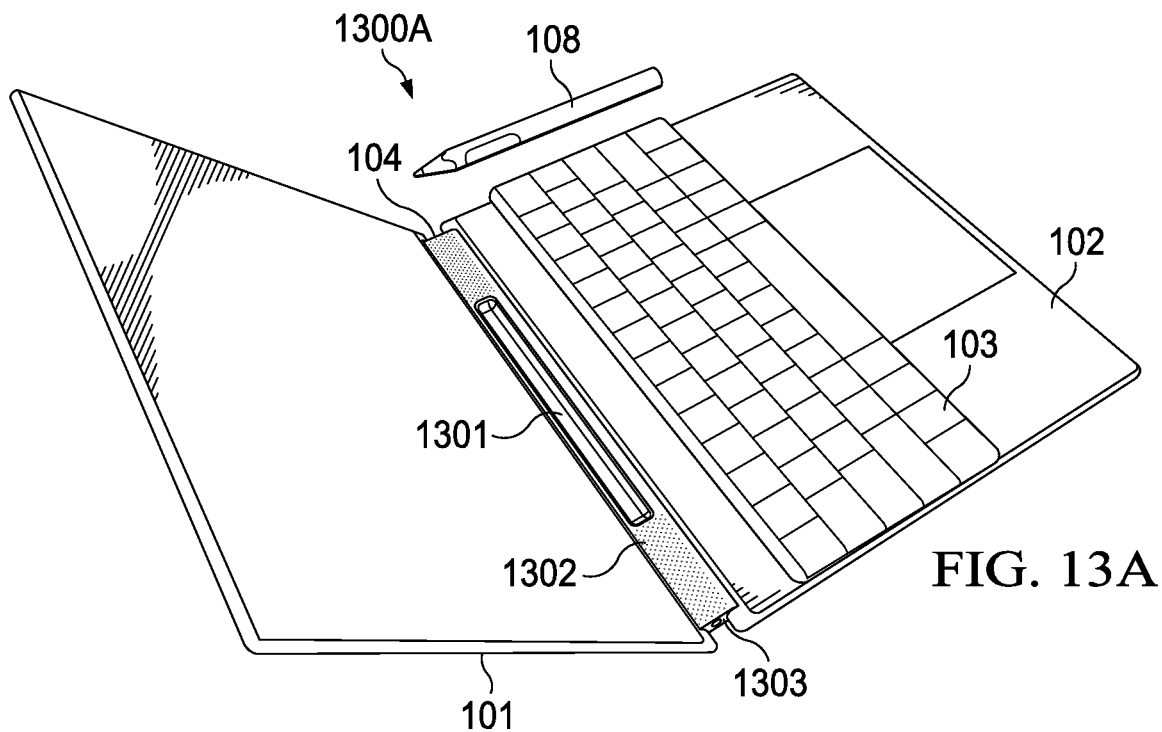
Figure 13B:
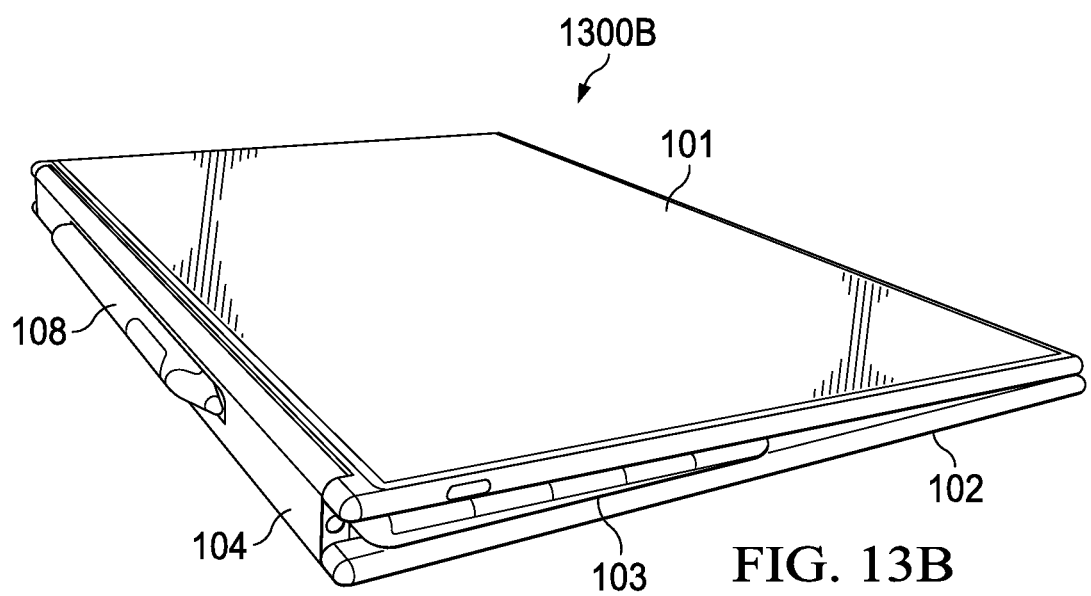

FIGS. 13A and 13B illustrate a jaws hinge implementation, usable as hinge 104 in IHS 100, in two different configurations 1300A and 1300B. Specifically, jaws hinge 104 has two rotation axes, parallel to each other, one axis for each respective one of displays 101/102. A solid bar element 104 between the two rotation axes may be configured to accommodate docking compartment 1301 for stylus 108, audio speaker(s) 1302 (e.g., monaural, stereo, a directional array), and one or more ports 1303 (e.g., an audio in/out jack).

Hinge configuration 1300A of FIG. 13A shows the laptop posture. In this case, jaws hinge 104 holds first display 101 up, at an obtuse angle with respect to second display 102. In contrast, hinge configuration 1300B of FIG. 13B shows a tablet or book posture, with jaws hinge 104 holding first and second displays 101 and 102 at a 360° angle with respect to each other, with keyboard 103 stored in between displays 101 and 102, in a back-to-back configuration, such that stylus 108 remains accessible to the user.

FIG. 14 illustrates accessory charging system 1400, with accessory wells 1301 and 1401 shown on hinge 104 that couples first display 101 to second display 102. In various embodiments, accessory wells 1301 and 1401 may be formed of molded or extruded plastic. In this example, accessory well 1301 is shaped to hold pen or stylus 108, and accessory well 1401 is shaped to hold earbud 109. In some implementations, wells 1301 and/or 1401 may include electrical terminals for charging a battery within the accessory, and/or to check a status of the accessory (e.g., presence, charge level, model or name, etc.).

Figure 15:
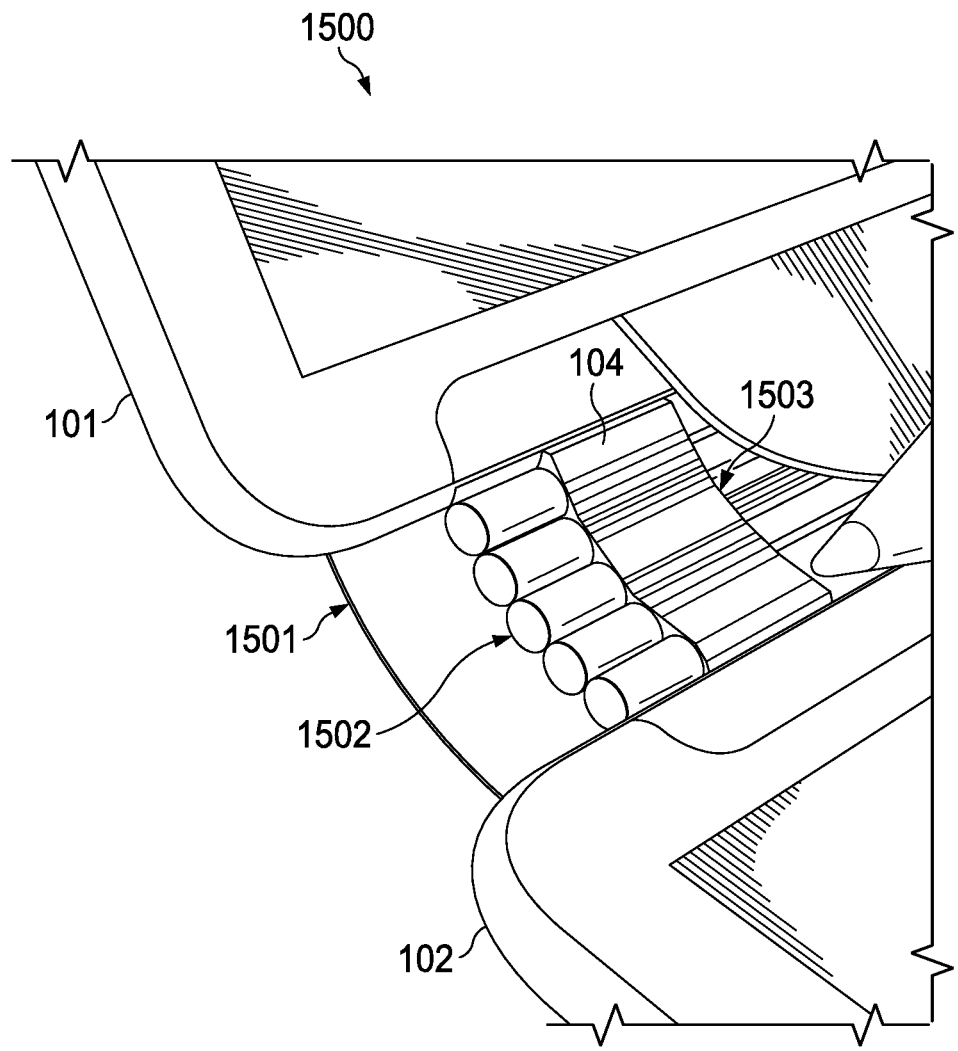

FIG. 15 illustrates a yoga hinge implementation, usable as hinge 104 in IHS 100, in configuration 1500. Specifically, yoga hinge 104 comprises a plurality of metal cylinders or rods, with axes parallel to each other, held together by bracket 1503 and/or fabric 1501. In operation, bracket 1503 may include notches and/or detents configured to hold cylinders 1502 at predetermined positions corresponding to any available IHS posture.

Figure 16B:
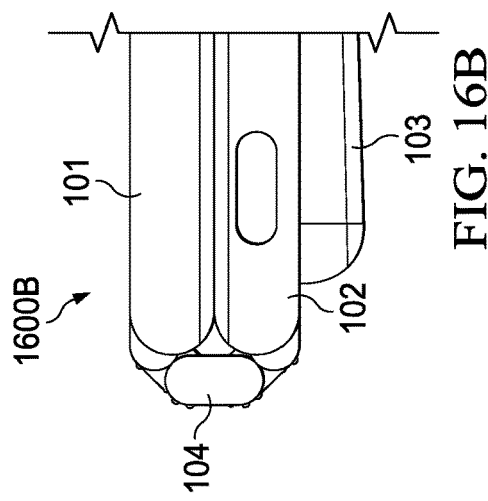
Figure 16C:
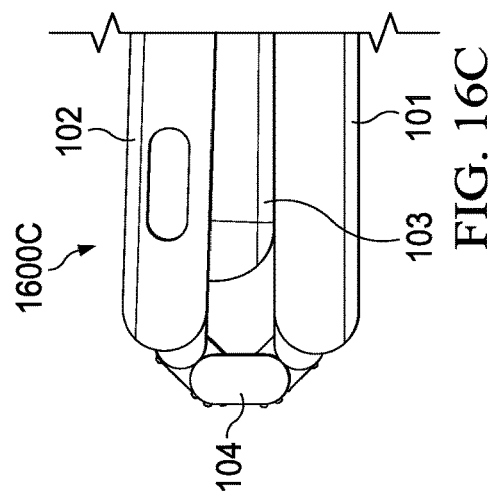
Figure 16A:
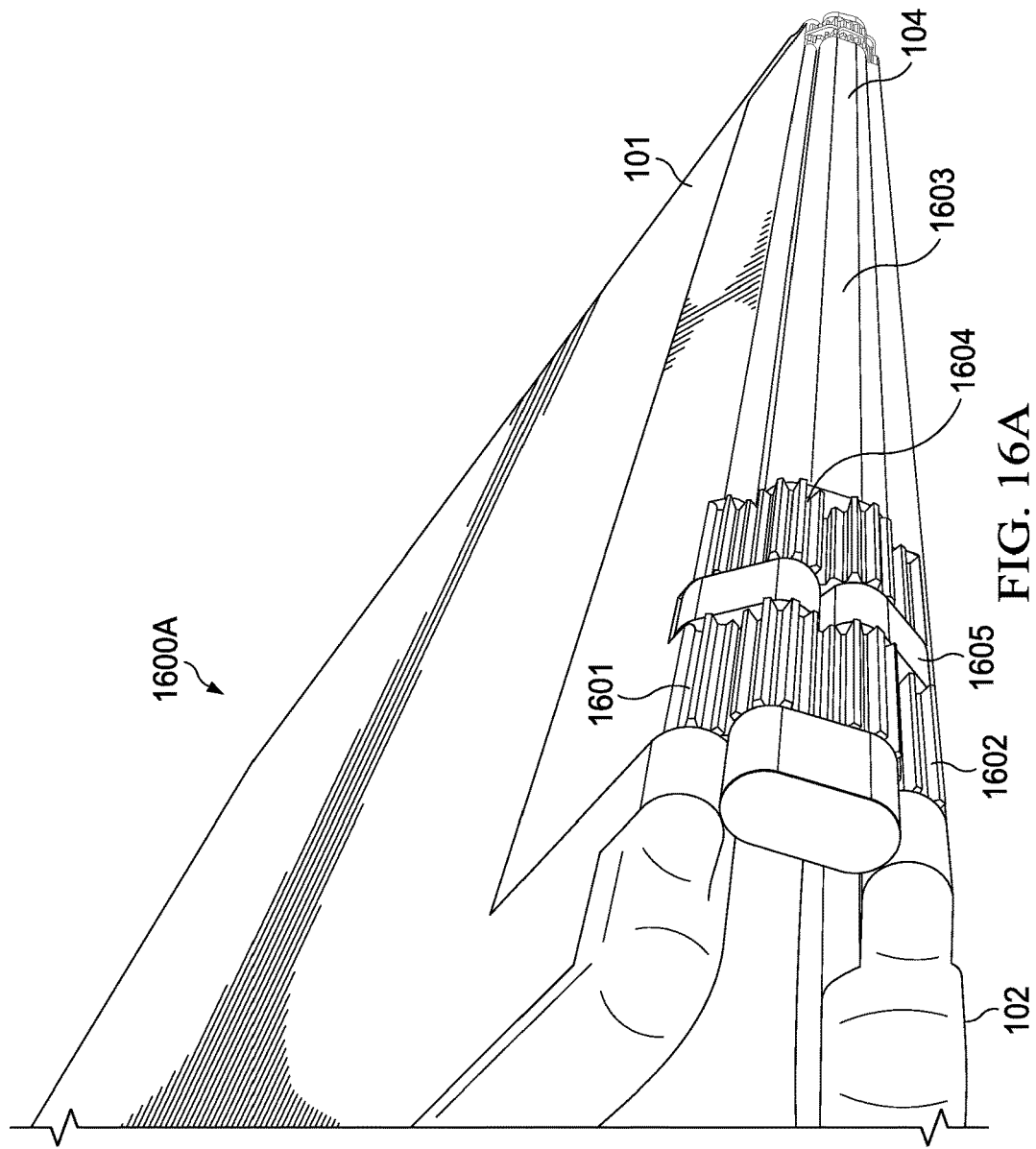

FIGS. 16A-C illustrate a gear hinge implementation, usable as hinge 104 in IHS 100, in configurations 1600A-C. Specifically, configuration 1600A of FIG. 16A shows gear hinge 104 with bar 1603 having teeth or gears 1604 fabricated thereon, as IHS 100 begins to assume a laptop posture. Display 101 has teeth or gears 1601 alongside its bottom edge, whereas display 102 has teeth or gears 1602 alongside its top edge. Bracket(s) 1605 hold gears 1601 and/or 1602 against gear 1604, therefore provides two parallel rotation axes between displays 101 and 102.

Figure 19:
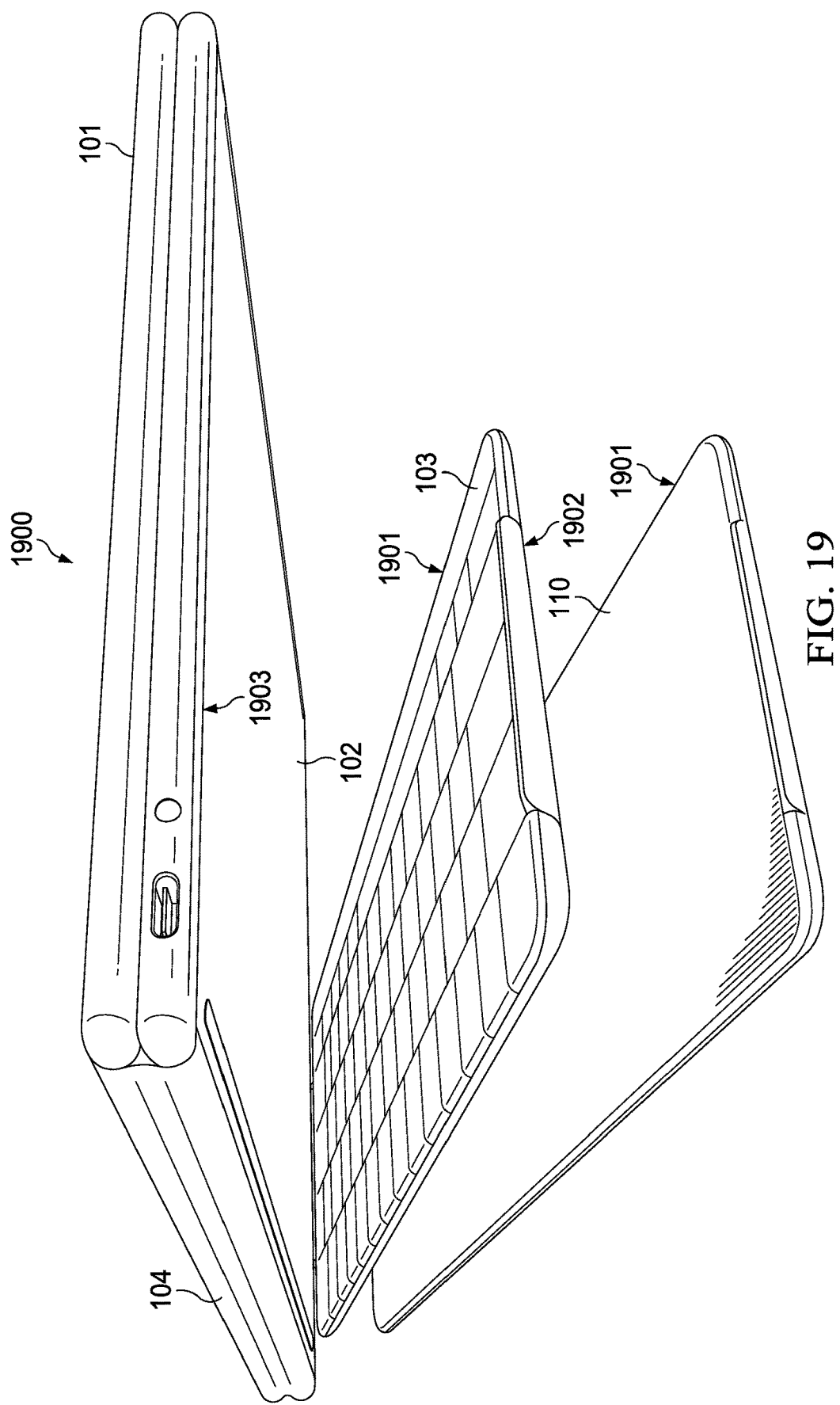
FIG. 19 illustrates an accessory backpack system, according to some embodiments.

Hinge configuration 1600B of FIG. 16B shows a closed posture. In this case, gear hinge 104 holds display 101 facing down, and display 102 is rotated 360° degrees with respect to display 101, so that its display surface faces up against display 101. In this configuration, keyboard 103 may sit under display 102, for example, to cause display 102 to rest at an angle when IHS 100 is placed in laptop posture. In some cases, keyboard 103 may be coupled to the back of display 102 using an accessory backpack or the like, as shown in FIG. 19.

Hinge configuration 1600C of FIG. 16C shows a tablet or book posture. In this case, gear hinge 104 holds display 102 facing up, and display 101 is rotated 360° degrees with respect to display 102, so that its display surface faces down against the horizontal plane. In this configuration, keyboard 103 rests between the back of display 101 and the back of display 102. In various embodiments, bar 1603 may be split into a plurality of segments or links, as shown in configurations 1600B and 1600C, to provide additional axes of rotation between displays 101 and 102, and to accommodate both keyboard options with different IHS thicknesses.

FIGS. 17A and 17B illustrate a slide hinge implementation, usable as hinge 104 in IHS 100, in various configurations. Specifically, in FIG. 17A, link 1701, held by first display bracket 1702 coupled to display 101, slides up and down slot 1704 of bracket 1703 coupled to display 102. In some cases, a locking mechanism may be employed to stably hold displays 101 and 102 in different postures, as link 1701 slides up and down and/or as display 101 rotates around display 102, such as the closed posture of configuration 1700A, the laptop posture of configuration 1700B in FIG. 17B, the tablet posture of configuration 1700C (back to FIG. 17A), or the book posture of configuration 1700D (also in FIG. 17A).

FIGS. 18A and 18B illustrate a folio case system in configurations 1800A and 1800B, according to some embodiments. Specifically, folio case 1801 may include a set of hard foldable sections or flaps wrapped in fabric and/or plastic, with snapping magnetic attachment points, for example, around the edge on the back of displays 101 and 102, and/or keyboard 103. In some cases, keyboard 103 may be removable from case 1801. Additionally, or alternatively, the presence and state of case 1801 may be detectable via sensors 303.

In configuration 1800A in FIG. 18A, displays 101 and 102 are in a laptop posture, and folio case 1801 holds keyboard 103 in a fixed position, off the bottom edge or long side of display 102, such that both displays 101 and 102 remain usable. Meanwhile, configuration 1800B of FIG. 18B shows a display posture (e.g., as in state 901), such that the display surface of display 102 is facing down against folio case 1802, and folio case 1802 holds keyboard 103 in at fixed location, off the bottom edge of display 101, and such that only display 101 is usable.

Figure 20:
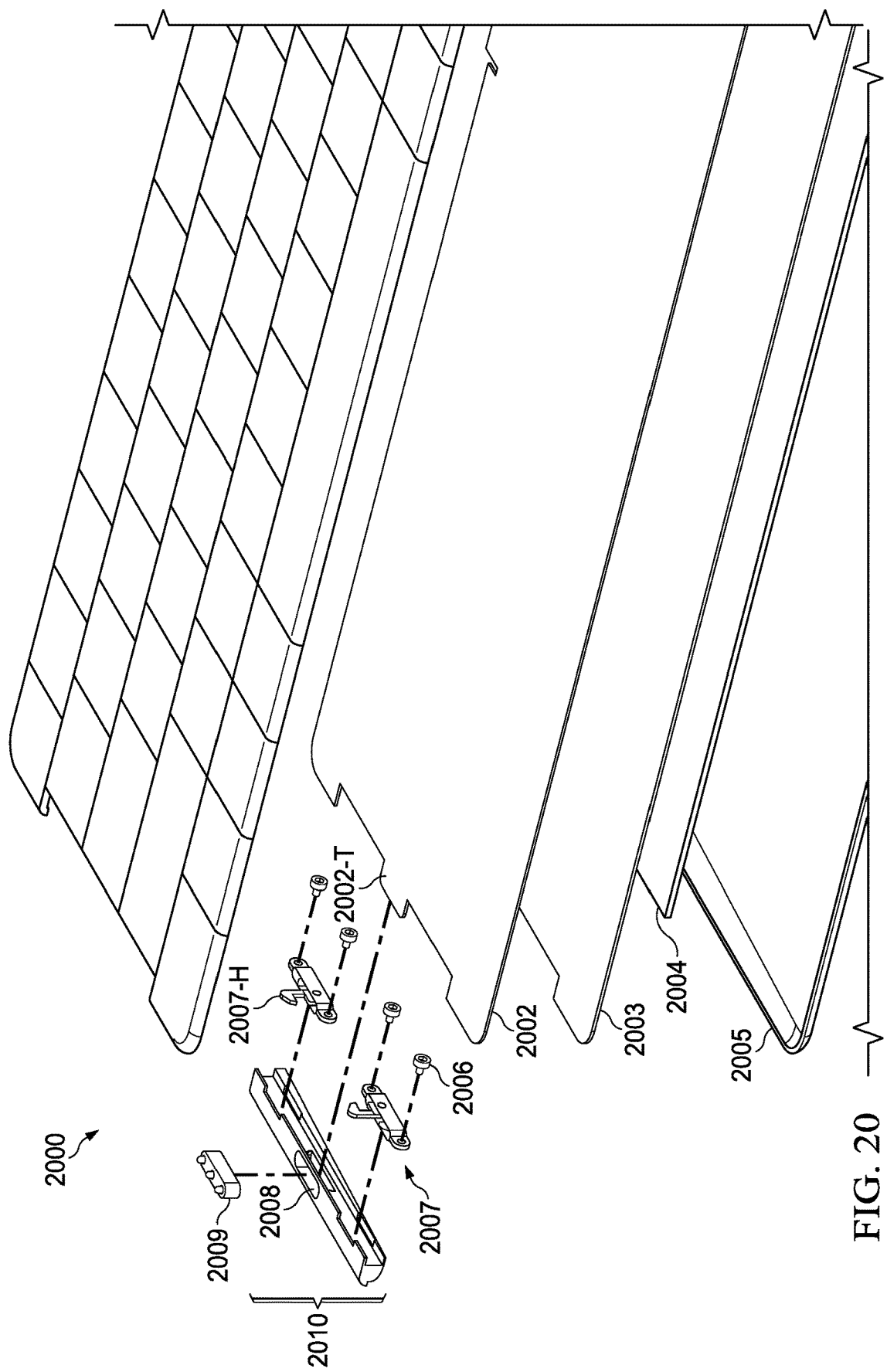
FIG. 20 illustrates an exploded view of an example of accessory components of an accessory backpack, according to some embodiments.

FIG. 19 illustrates accessory backpack system 1900. In some embodiments, the enclosure of display 102 may include notches 1903 configured to receive lip 1902 of tray 1901, which stays snapped in place until pulled by the user. Additionally, or alternatively, a spring-loaded ejection button may be used. In various configurations, tray 1901 may hold keyboard 103 or battery 110. Moreover, in some cases, the enclosure of display 102 may include electrical terminals usable to charge and/or obtain sensor information from accessories FIG. 20 shows an exploded view of accessory components of an accessory backpack implementation, such as accessory backpack system 1900 of FIG. 19. In some embodiments, accessory 2000 may be keyboard 103. In other embodiments, however, accessory 2000 may be any other IHS accessory, such as a dedicated battery pack, or the like. As shown, keyboard 103 may include: keycap assembly 2001 (e.g., QWERTY key caps, key actuators, membranes, etc.), flex 2002 (e.g., a keyboard matrix, backlighting layer, etc.), battery layer 2003, frame 2004, and case 2005.

In various embodiments, each bracket 2010 (of a pair of brackets, one on each side of keyboard 103; left one shown) may have one or more cavities configured to hold one or more hook assemblies 2007—including hook 2007-H— coupled to it using one or more fasteners 2006. Hook assemblies 2007 and/or hooks 2007-H may be made of metal, may be magnetized, and/or may include magnetic devices, such that, keyboard 103 may be magnetically coupled to IHS 100.

Bracket 2010 may also have another cavity 2008, between hook assemblies 2007, configured to house charging interface connector 2009 having electrical terminals that charge battery 2003 in response to keyboard 103 being coupled to second display 102. To this end, flex 2002 may include tab portion 2002-T, which extends from the short side of flex 2002, and couples electronic circuit(s) within keyboard 103 to connector 2009.

In some implementations, keyboard 103 may have a total thickness of approximately 6 mm at the back, and 4.3 mm at the front, with a flat bottom case. Thickness may be further reduced by using maglev keys, a slim battery, no connectors, no PCB, and/or no backlight. Additionally, or alternatively, a haptics-based keyboard may be used in lieu of key activation by mechanical travel.

A thicker flex 2002 (e.g., 0.4 mm) may be used for mounting components, antenna, charging pads, and/or battery, eliminating the need for a connector and a Printed Circuit Board (PCB). For example, flex 2002 may be folded around frame 2004 and/or case 2005, and coupled to it with double-sided tape.

Bracket 2010 may have a thin (e.g., 0.8 mm) ceiling and/or floor to keep corresponding magnets close together. In some cases, magnetic hook assemblies 2007 may include N50 magnets, at a distance of approximately 1.6 mm from each other, to provide a holding force (Z direction).

Figure 21A:
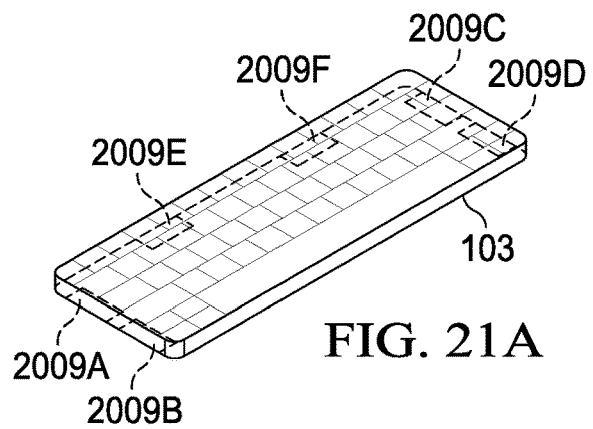
FIGS. 21A-C illustrate an example of an accessory alignment system, according to some embodiments.
Figure 21B:
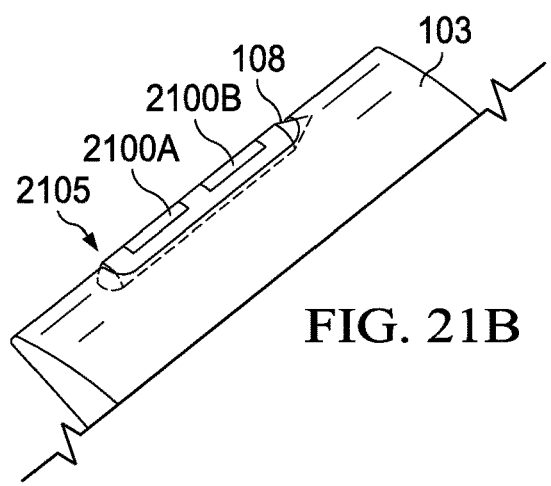
Figure 21C:
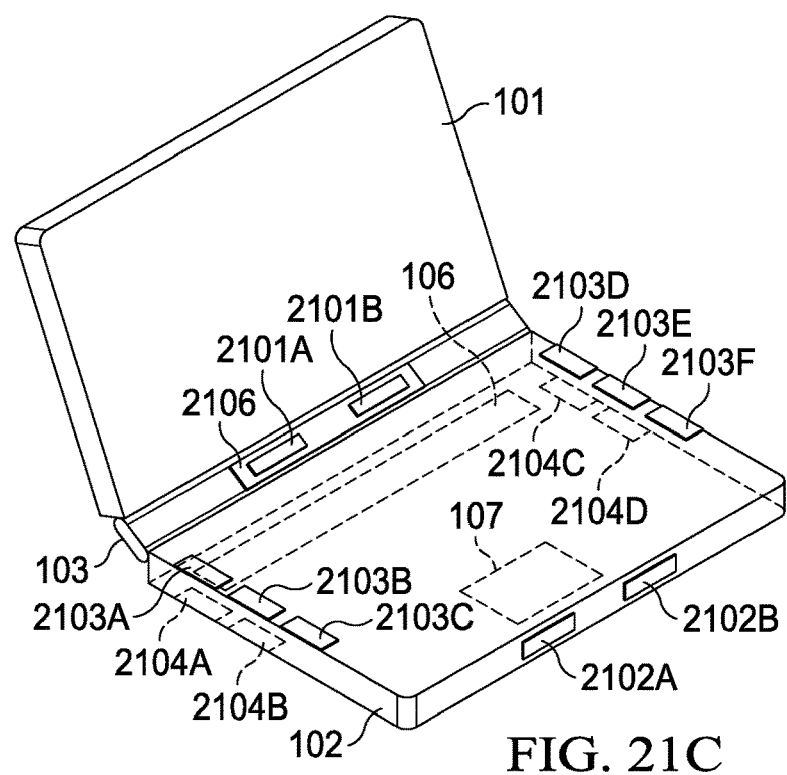

FIGS. 21A-C illustrate an example of an accessory alignment system. In various embodiments, such an accessory alignment system may enable keyboard 103 (or any other accessory, such as a battery pack, etc.) to be attached to display 102 at predetermined locations on and off the display surface of display 102, and/or to the back surface of display 102. Moreover, display and/or hinge sensors 210 may be configured to determine which of a plurality of magnetic devices are presently engaged, so that the current position of keyboard 103 may be ascertained with respect to IHS 100, and such that selected UI features may be provided in response to the keyboard's position.

Particularly, FIG. 21A illustrates an example of attachable keyboard 103 having magnetic devices 2009A, 2009B, 2009C, and 2009D symmetrically disposed along its left and right short sides, at selected locations. In some cases, each of magnetic devices 2009A, 2009B, 2009C, and 2009D may include N50 magnets (e.g., 19×4.3×2.1 mm), also at a distance of about 1.6 mm from each other, to provide approximately 18.5 N of holding force.

Additionally, or alternatively, each of magnetic devices 2009A, 2009B, 2009C, and 2009D may be part of a corresponding one of hook assemblies 2007 and/or hooks 2007-H. Additionally, or alternatively, keyboard 103 may include magnetic devices 2009E and 2009F disposed alongside the top, long side of keyboard 103.

FIG. 21B illustrates an example of attachable keyboard 103 with stylus 108 coupled to stylus well 2105. In some implementations, stylus 108 may have a compressible tip mated to a hole in stylus well 2105 that is configured to mechanically hold stylus 108 in place alongside the long edge of keyboard 103. Moreover, stylus 108 may include one or more magnetic devices 2100A and 2100B.

FIG. 21C illustrates an example of second display 102 configured for an attachable keyboard 103. Particularly, display 102 includes magnetic devices 2103A, 2103B, 2103D, and 2103E, which correspond to magnetic devices 2009A, 2009B, 2009C, and 2009D in keyboard 103, and which snap keyboard 103 into a predetermined place over the display surface of display 102, in a first position alongside the short side of display 102 that enables hinge 104 to close and to sandwich keyboard 103 between displays 101 and 102.

Additionally, or alternatively, display 102 may include magnetic devices 2103C and 2103F. In combination, magnetic devices 2103B, 2103C, 2103E, and 2103F, which correspond to magnetic devices 2009A, 2009B, 2009C, and 2009D of keyboard 103, snap keyboard 103 into place over the display surface of display 102, in a second position alongside the short side of display 102 that enables rendering of first UI feature 106 (e.g., ribbon area) and/or second UI feature 107 (e.g., touchpad).

Additionally, or alternatively, display 102 may include magnetic devices 2102A and 2102B, which correspond to magnetic devices 2009E and 2009F in keyboard 103 and/or magnetic devices 2100A and 2100B in stylus 108. In some cases, magnetic devices 2102A and 2102B may be configured to snap keyboard 103 to the long edge of display 102, outside of its display surface.

Additionally, or alternatively, display 102 may include magnetic devices 2104A, 2104B, 2104C, and 2104D, which correspond to magnetic devices 2009A, 2009B, 2009C, and 2009D of keyboard 103, and cause keyboard 103 to snap to the back of display 102, for example, as part of an accessory backpack. In various implementations, each of magnetic devices 2104A, 2104B, 2104C, and 2104D may include a catch configured to hold a corresponding one of hooks 2007-H. When hooks 2007-H are also magnetized, the polarities of each of magnetic devices 2103A-F, 2104A, 2104B, 2104C, 2104D may be opposite to the polarities of each corresponding one of hooks 2007-H.

In some cases, hinge 104 may also include stylus well 2106. As shown, stylus well 2106 may include at least one of magnetic devices 2101A and 2101B, corresponding to magnetic devices 2009E and 2009F in keyboard 103 and/or magnetic devices 2100A and 2100B in stylus 108. As such, magnetic devices 2101A and 2101B may be configured to hold keyboard 103 and/or stylus 108 in place when keyboard 103 is sandwiched between displays 101 and 102.

Figure 22A:
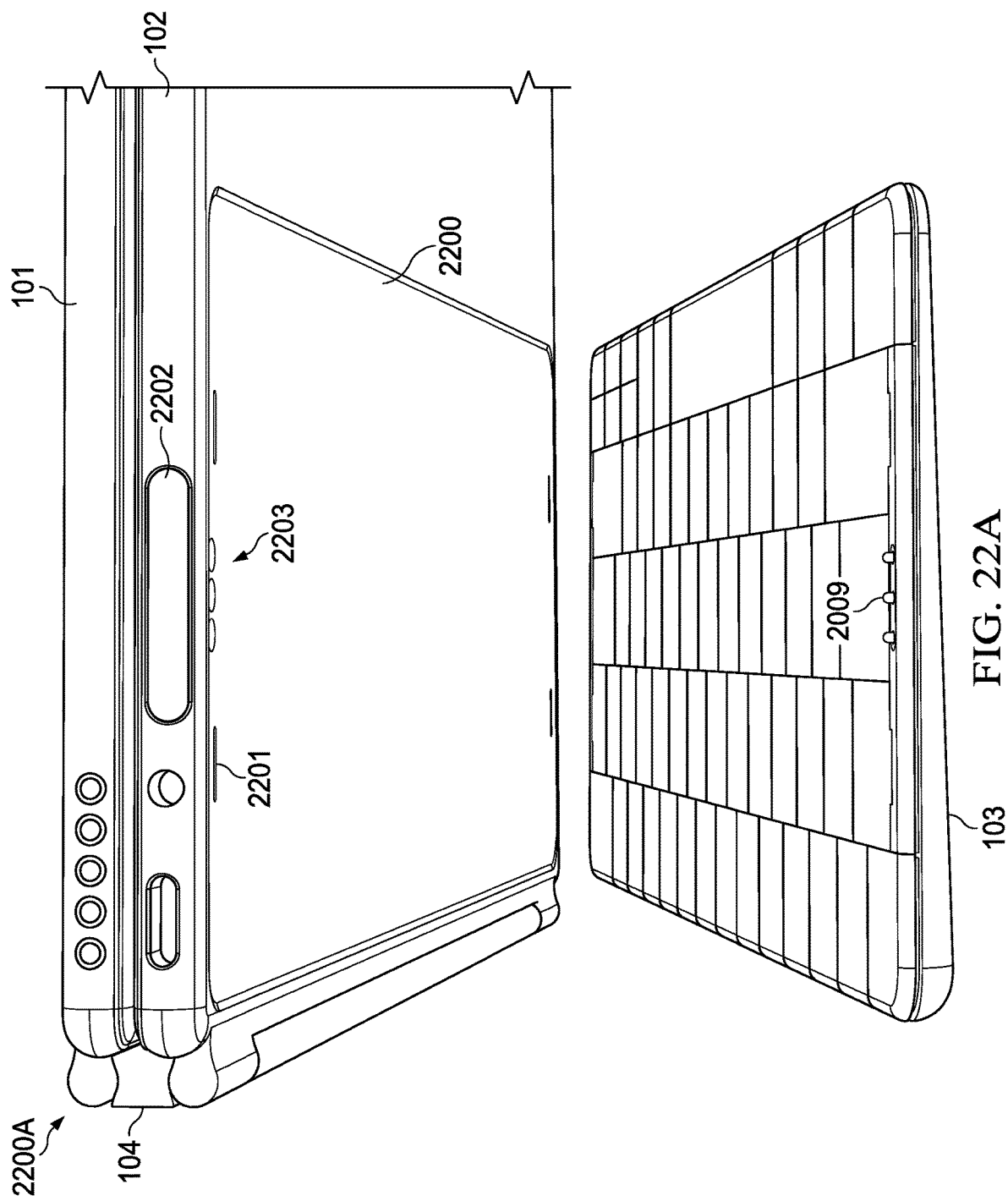
Figure 23A:
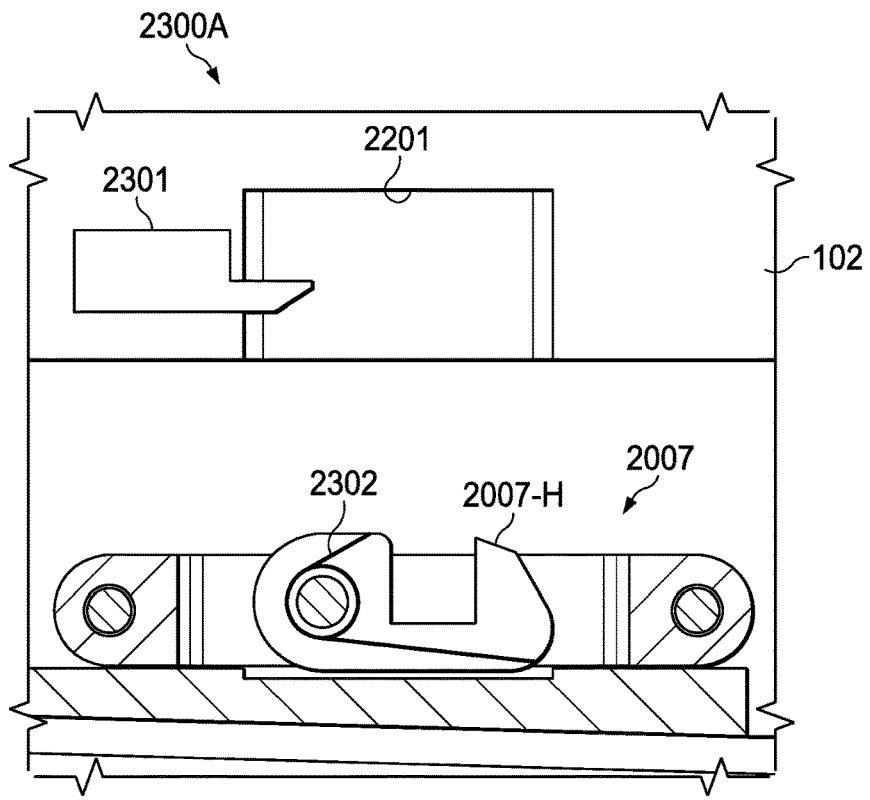
FIGS. 23A and 23B illustrate cutout views of the accessory backpack in different configurations, according to some embodiments.
Figure 23B:
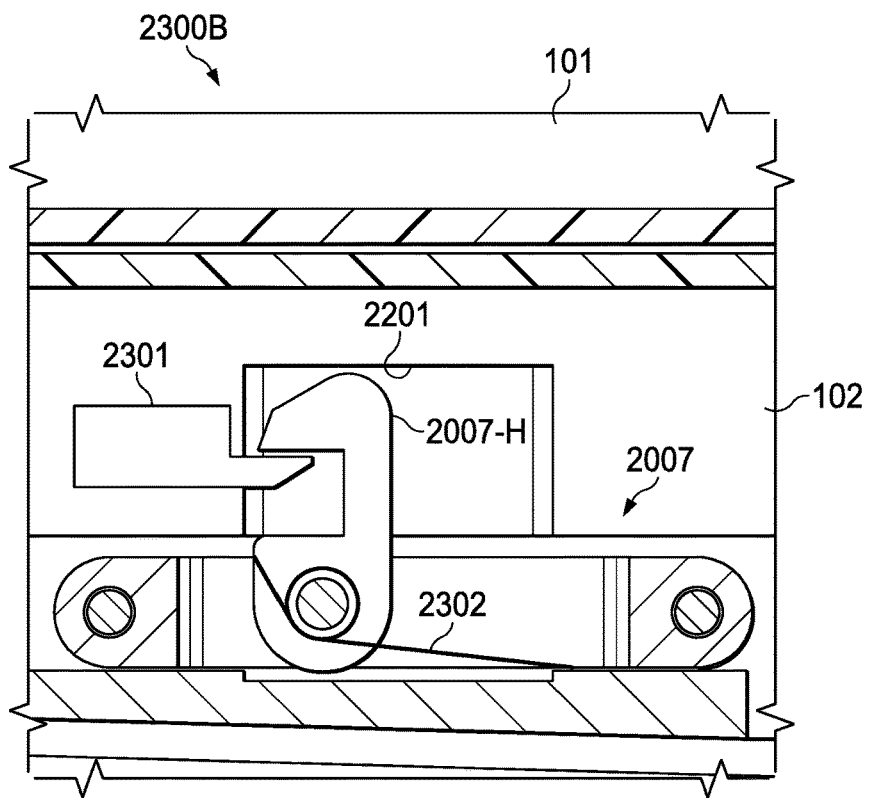

FIGS. 22A and 22B illustrate operation of the accessory backpack, and FIGS. 23A and 23B show cutout views of the accessory backpack in different configurations. Particularly, in configuration 2200A of FIG. 22A, the top surface of keyboard 103 is disposed at a first distance from the bottom of display 102. Display 102 may include recessed area 2200 having a set of slots 2201, and one or more electrical terminals 2203 configured to match connector 2009. At this first distance, hooks 2007-H are sunk or recessed into keyboard 103, and disengaged from display 102, and hooks 2007-H may be spring-loaded toward the bottom portion of keyboard 103.

Configuration 2200A of FIG. 22A is also shown in cutout view 2300A of FIG. 23A, where hook 2007-H of hook assembly 2007 is recessed into keyboard 103 under mechanical force exerted by spring 2302. Spring 2302 may be a torsion spring configured to rotate around an axis to create load in the clockwise direction against hook 2007-H. Cutout view 2300A also shows catch 2301 in slot 2201, in the absence of action by actuator 2202. Actuator 2202 may be implemented as a push button or a slide configured to translate catch 2301 in and out of slot 2201, upon actuation, to engage and/or disengage hook 2007-H.

In configuration 2200B of FIG. 22B, the top surface of keyboard 103 is disposed at a second distance from the bottom of display 102, such that the second distance is shorter than the first distance. At this second distance, hooks 2007-H are magnetically pulled out of keyboard 103 by magnetic catch 2301, against the mechanical force presented by torsion spring 2302. Cutout view 2300B of FIG. 23B shows hook 2007-H engaged with catch 2301 in slot 2201, once the top surface of keyboard 103 touches the bottom case of display 102.

In various embodiments, an accessory backpack as described herein may include a first set of two or more catches alongside a first short side (e.g., left) of display 102, and a second set of two or more catches alongside a second short side (e.g., right) of display 102. A first set of hooks or hook assemblies may be disposed alongside a first short side (e.g., left) of keyboard 103, and a second set of hooks alongside a second short side (e.g., right) of keyboard 103.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
    a first display; and
    a second display coupled to the first display, wherein the second display comprises a recessed area with a catch, and wherein the catch is configured to magnetically engage a corresponding hook of an accessory in response to a top surface of the accessory being placed into the recessed back portion of the second display.

2. The IHS of claim 1, further comprising:
    a first set of catches alongside a first short side of the second display;
    a first set of hooks alongside a first short side of the accessory, wherein each catch of the first set of catches is configured to magnetically engage a corresponding hook of the first set of hooks;
    a second set of catches alongside a second short side of the second display; and
    a second set of hooks alongside a second short side of the accessory, wherein each catch of the second set of catches is configured to magnetically engage a corresponding hook of the second set of hooks.

3. The IHS of claim 2, further comprising an electrical charging port located between the first and second sets of catches, the electrical charging port configured to charge the accessory in response to the accessory being coupled to the second display.

4. The IHS of claim 2, wherein the first and second sets of catches are positioned alongside the short sides of the second display at locations that enable rendering, in response to the accessory being placed atop the second display, of:
- a first User Interface (UI) feature, in a display area above a first long side of the accessory, in response to the accessory being placed atop the display surface; and
- a second UI feature in another display area below a second long side of the accessory, in response to the accessory being placed atop the display surface.

5. The IHS of claim 1, further comprising an actuator configured to translate the catch at least until it releases the hook.

6. The IHS of claim 5, wherein the hook is spring-loaded to a disengaged position within the accessory in response to the actuator.

7. The IHS of claim 6, wherein the hook is magnetized with an opposite polarity than a polarity of the catch.

8. The IHS of claim 1, wherein the accessory comprises a keyboard.

9. The IHS of claim 1, wherein the accessory comprises a battery.

10. A method, comprising:
- attaching an accessory to an Information Handling System (IHS) having a first display and a second display coupled to the first display, wherein the second display comprises a catch, and wherein the catch is configured to magnetically engage a corresponding hook of the accessory in response to a top surface of the accessory being placed under a back portion of the second display;
- detaching the accessory from the IHS;
- detecting a posture of the IHS; and
- in response to a laptop posture, identifying a position of the accessory disposed on the second display and rendering a graphical feature on the second display based upon the position of the accessory on the second display.

11. The method of claim 10, wherein the IHS further comprises:
- a first set of catches alongside a first short side of the second display;
- a first set of hooks alongside a first short side of the accessory, wherein each catch of the first set of catches is configured to magnetically engage a corresponding hook of the first set of hooks;
- a second set of catches alongside a second short side of the second display; and
- a second set of hooks alongside a second short side of the accessory, wherein each catch of the second set of catches is configured to magnetically engage a corresponding hook of the second set of hooks.

12. The method of claim 10, further comprising charging the accessory in response to the accessory being coupled to the second display.

13. The method of claim 10, wherein detaching the accessory further comprises translating the catch at least until it releases the hook.

14. The method of claim 13, wherein the hook is spring-loaded to a disengaged position within the accessory.

15. The method of claim 10, wherein the accessory comprises a keyboard or a battery.

16. A hardware memory device having program instructions stored thereon that, upon execution by a processor of an Information Handling System (IHS) having a first display coupled to a second display cause the IHS to:
- determine that a top surface of an accessory is placed engaged in a back portion of the second display, wherein the accessory comprises a first set of recessed hooks alongside the first short side of the accessory and a second set of recessed hooks alongside the second short side of the accessory when the accessory is disengaged; and
- charge the accessory in response to the determination.

17. The hardware memory device of claim 16, wherein the second display comprises a catch, and wherein the catch is configured to magnetically engage a corresponding hook of the accessory.

18. The hardware memory device of claim 17, wherein the IHS further comprises:
- a first set of catches alongside a first short side of the second display;
- the first set of hooks alongside a first short side of the accessory, wherein each catch of the first set of catches is configured to magnetically engage a corresponding hook of the first set of hooks;
- a second set of catches alongside a second short side of the second display; and
- the second set of hooks alongside a second short side of the accessory, wherein each catch of the second set of catches is configured to magnetically engage a corresponding hook of the second set of hooks.

19. The hardware memory device of claim 18, wherein the IHS further comprises an actuator configured to translate the catch at least until it releases the hook, and wherein the hook is spring-loaded to a disengaged position within the accessory in response to the actuator.

20. The hardware memory device of claim 19, wherein the accessory comprises a keyboard or a battery.

* * * * *